(12) United States Patent
Hong et al.

(10) Patent No.: US 12,550,439 B2
(45) Date of Patent: Feb. 10, 2026

(54) DISPLAY DEVICE AND METHOD FOR MANUFACTURING SAME

(71) Applicant: Samsung Display Co., LTD., Yongin-si (KR)

(72) Inventors: Kwang Taek Hong, Seoul (KR); Myeong Hun Song, Daegu (KR); Jin Taek Kim, Yongin-si (KR); Sung Geun Bae, Busan (KR); Seung Min Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 585 days.

(21) Appl. No.: 17/926,844

(22) PCT Filed: Jun. 17, 2020

(86) PCT No.: PCT/KR2020/007831
§ 371 (c)(1),
(2) Date: Nov. 21, 2022

(87) PCT Pub. No.: WO2021/235589
PCT Pub. Date: Nov. 25, 2021

(65) Prior Publication Data
US 2023/0207571 A1 Jun. 29, 2023

(30) Foreign Application Priority Data
May 22, 2020 (KR) .......................... 10-2020-0061734

(51) Int. Cl.
*H10D 86/60* (2025.01)
*H01L 25/16* (2023.01)
(Continued)

(52) U.S. Cl.
CPC ........... *H10D 86/60* (2025.01); *H01L 25/167* (2013.01); *H10D 86/441* (2025.01); *H10H 20/856* (2025.01); *H10H 20/857* (2025.01)

(58) Field of Classification Search
CPC .... H10D 86/60; H10D 86/441; H10H 20/857; H10H 20/856; H01L 25/167
See application file for complete search history.

(56) References Cited

U.S. PATENT DOCUMENTS

| 10,026,777 B2 * | 7/2018 | Kang | .................. H01L 25/0753 |
| 2011/0133241 A1 * | 6/2011 | Song | .................... H10H 20/833 438/22 |

(Continued)

FOREIGN PATENT DOCUMENTS

| KR | 10-2010-0037987 | 4/2010 |
| KR | 10-2018-0007025 | 1/2018 |

(Continued)

OTHER PUBLICATIONS

Seo et al., KR 10-2019-0102382, Sep. 4, 2019 (Year: 2019).*

(Continued)

*Primary Examiner* — Mary Ellen Bowman
(74) *Attorney, Agent, or Firm* — Womble Bond Dickinson (US) LLP

(57) ABSTRACT

Provided are a display device and a method for manufacturing the same. The display device includes banks extending in a first direction on a substrate and spaced apart from each other; a first electrode and a second electrode extending in the first direction and spaced apart from each other on different banks; an insulation layer disposed on the substrate and partially covering the first electrode and the second electrode; and light emitting elements disposed on the insulation layer and having ends disposed on the first electrode and the second electrode wherein the first electrode and the second electrode generate an electric field (Continued)

when a magnetic field is applied to the first electrode and the second electrode.

20 Claims, 25 Drawing Sheets

(51) Int. Cl.
*H10D 86/40* (2025.01)
*H10H 20/856* (2025.01)
*H10H 20/857* (2025.01)

(56) References Cited

U.S. PATENT DOCUMENTS

| | | | |
|---|---|---|---|
| 2018/0175106 A1* | 6/2018 | Kim | H10H 20/84 |
| 2020/0152835 A1* | 5/2020 | Ko | H10H 29/142 |
| 2020/0314515 A1* | 10/2020 | Jang | H10K 59/8722 |
| 2021/0202810 A1* | 7/2021 | Jung | H01L 25/167 |
| 2021/0391308 A1* | 12/2021 | Sim | H10H 20/821 |

FOREIGN PATENT DOCUMENTS

| | | |
|---|---|---|
| KR | 10-2019-0006430 | 1/2019 |
| KR | 20190087221 A | 7/2019 |
| KR | 10-2019-0102382 | 9/2019 |
| KR | 10-2100436 | 4/2020 |
| KR | 10-2020-0053726 | 5/2020 |
| KR | 10-2021-0053391 | 5/2021 |
| KR | 10-2021-0081506 | 7/2021 |

OTHER PUBLICATIONS

Yusuke Tokunaga et al., "Composite domain walls in a multiferroic perovskite ferrite", nature materials, Jun. 7, 2009, pp. 558-562, vol. 8.

N. Hur et al., "Electric Polarization Reversal and Memory in a Multiferroic Material Induced by Magnetic Fields", Nature, Jun. 2004, pp. 1-4.

International Search Report, with English translation, corresponding to International Application No. PCT/KR2020/007831, dated Feb. 18, 2021.

Korean Notice of Allowance issued Jun. 26, 2025, in corresponding Korean Patent Application No. KR 10-2020-0061734 (2 pages).

* cited by examiner

PXn: PX1, PX2, PX3

DISPLAY DEVICE AND METHOD FOR MANUFACTURING SAME

CROSS-REFERENCE TO RELATED APPLICATION(S)

This application is a national entry of International Application No. PCT/KR2020/0007831, filed on Jun. 17, 2020, which claims under 35 U.S.C. §§ 119(a) and 365(b) priority to and benefits of Korean Patent Application No. 10-2020-0061734, filed on May 22, 2020, in the Korean Intellectual Property Office (KIPO), the entire contents of which are incorporated herein by reference.

BACKGROUND

1. Technical Field

The disclosure relates to a display device and a method of manufacturing the same.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, may include a display panel such as an OLED display panel or an LCD panel. The display panel may include light-emitting elements such as light-emitting diodes (LEDs), and the LEDs may be classified into OLEDs using an organic material as a fluorescent material and inorganic LEDs using an inorganic material as a fluorescent material.

Inorganic LEDs, which use an inorganic semiconductor as a fluorescent material, are durable even in a high-temperature environment and have a higher blue light efficiency than OLEDs. Also, to overcome the limitations of conventional inorganic LEDs, a transfer method using dielectrophoresis (DEP) has been developed. Accordingly, research has been continued on inorganic light emitting diodes having an excellent durability and efficiency, as compared to organic light emitting diodes.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

To address the aforementioned problems, embodiments provide a method of manufacturing a display device, which can improve the degree of alignment of light-emitting elements on electrodes.

Embodiments also provide a display device capable of minimizing the oxidation of electrodes.

Additional advantages, subjects, and features will be set forth in part in the description which follows and in part will become apparent to those having ordinary skill in the art upon examination of the following or may be learned from practice of the disclosure.

SUMMARY

According to an embodiment, a display device may include banks extending in a first direction on a substrate, the banks spaced apart from each other; first electrodes and second electrodes extending in the first direction, the first electrodes and the second electrodes disposed on different banks and spaced apart from each other; an insulating layer disposed on the substrate, the insulating layer partially covering the first electrodes and the second electrodes; and light-emitting elements disposed on the insulating layer, end portions of each of the light-emitting elements disposed on the first electrodes and the second electrodes, wherein the first electrodes and the second electrodes generate an electric field in response to an applied magnetic field.

The first and second electrodes may have a reflectance in a range of about 20 to about 85% for a wavelength band in a range of about 400 nm to about 700 nm.

The first electrodes and the second electrodes may have a Curie temperature of about 800° C. or less.

The first electrodes and the second electrodes may include at least one selected from $BiFeO_3$, hexa-ferrites, $TbMn_2O_5$, and $CoCr_2O_4$.

The first electrodes and the second electrodes may generate a magnetic field in response to an applied electric field.

The display device may further comprise a reflective layer disposed between the first electrodes and the insulating layer and between the second electrodes and the insulating layer.

The reflective layer may have a higher reflectance than a reflectance of the first electrodes or the second electrodes.

The display device may further comprise a first contact electrode disposed on the first electrodes electrically contacting end portions of the light-emitting elements, and a second contact electrode disposed on the second electrodes electrically contacting second end portions of the light-emitting elements.

Each of the light-emitting elements may include a first semiconductor layer; a second semiconductor layer; and at least one light-emitting layer disposed between the first semiconductor layer and the second semiconductor layer, and the first semiconductor layer, the second semiconductor layer, and the at least one light-emitting layer may be surrounded by an insulating film.

According to an embodiment, a method of manufacturing a display device may include preparing a substrate including first electrode layers and second electrode layers, and spraying ink including a solvent and light-emitting elements dispersed in the solvent onto the substrate; generating a first electric field on the substrate and primarily aligning light-emitting elements on the first electric field on the substrate; and generating a second electric field by applying a magnetic field to the first electrode layers or the second electrode layers, and secondarily aligning the light-emitting elements on the substrate.

The first electric field may be generated by a current into the first electrode layers or the second electrode layers.

In the secondarily aligning of the light-emitting elements, the magnetic field may be applied to the first electrode layers or the second electrode layers by application of an external coil.

The first electrode layers or the second electrode layers may generate the second electric field in accordance with an intensity of the magnetic field.

The light-emitting elements may be rotated and realigned by inducing dipole moments in the light-emitting elements with the second electric field to apply a rotational torque to the light-emitting elements.

The rotational torque may be applied to the light-emitting elements by a magnetic force of the first electrode layers or second electrode layers to which the magnetic field is applied.

After the primarily aligning of the light-emitting elements, a degree of alignment of the light-emitting elements may be measured from an area to another area of the substrate, and the magnetic field may be applied to areas where the degree of alignment of the light-emitting elements is low.

The degree of alignment of the light-emitting elements may be measured by acquiring an image of each area of the substrate by an inspection device including a camera, and measuring an orientation direction of the light-emitting elements.

The orientation direction of the light-emitting elements may be measured by measuring locations of end portions of each of light-emitting elements disposed between the first electrode layers and the second electrode layers.

The method may further comprise after the secondarily aligning of the light-emitting elements, removing the solvent and fixing the light-emitting elements such that first end portions of the light-emitting elements are disposed on the first electrode layers and second end portions of the light-emitting elements are disposed on the second electrode layers.

The method may further comprise forming an insulating layer on the substrate with the solvent removed and disconnecting parts of the first electrode layers and the second electrode layers.

The details of other embodiments are included in the detailed description and the accompanying drawings.

According to embodiments, as first and second electrodes for aligning light-emitting elements are formed of an oxide material, the first and second electrodes can be prevented from being oxidated during the fabrication of a display device.

Also, as the first and second electrodes for aligning the light-emitting elements are formed of a material having multiferroic properties, light-emitting elements aligned by an electric field can be realigned by a magnetic field, and as a result, the degree of alignment of the light-emitting elements can be improved.

The effects according to embodiments are not limited by the effects described above, and more various effects are included in this disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
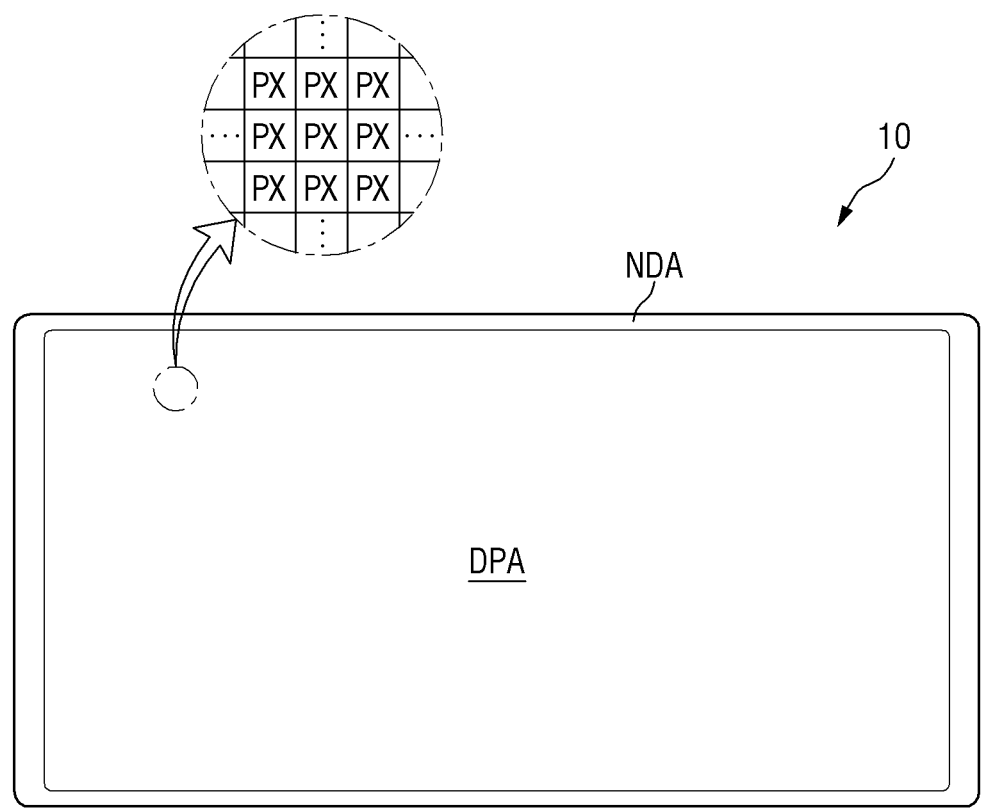
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like within the spirit and the scope of the disclosure.

The display device 10 may include a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like within the spirit and the scope of the disclosure. The display panel of the display device 10 will hereinafter be described as being, for example, an ILED display panel, but the disclosure is not limited thereto. For example, various other display panels are also applicable to the display panel of the display device 10.

The shape of the display device 10 may vary. In one example, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA have a rectangular shape extending longer horizontally than vertically. It is to be understood that the shapes disclosed herein may also include shapes substantial to the shapes disclosed herein.

The display device 10 may include the display area DPA and a non-display area NDA. The display area DPA may be an area in which a screen is displayed, and the non-display area NDA may be an area in which a screen is not displayed. The display area DPA may also be referred to as an active area, and the non-display area NDA may also be referred to as an inactive area. The display area DPA may occupy the middle part of the display device 10.

The display area DPA may include pixels PX. The pixels PX may be arranged (or disposed) in row and column directions. Each of the pixels PX may have a rectangular or square shape in a plan view, but the disclosure is not limited thereto. As another example, each of the pixels PX may have a rhombus shape having sides inclined with respect to a particular direction. The pixels PX may be alternately arranged in a stripe arrangement or a PENTILE™ arrangement. Each of the pixels PX may include one or more light-emitting elements, which emit light of a particular wavelength range.

The non-display area NDA may be disposed around the display area DPA. The non-display area NDA may surround the entire display area DPA or part of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
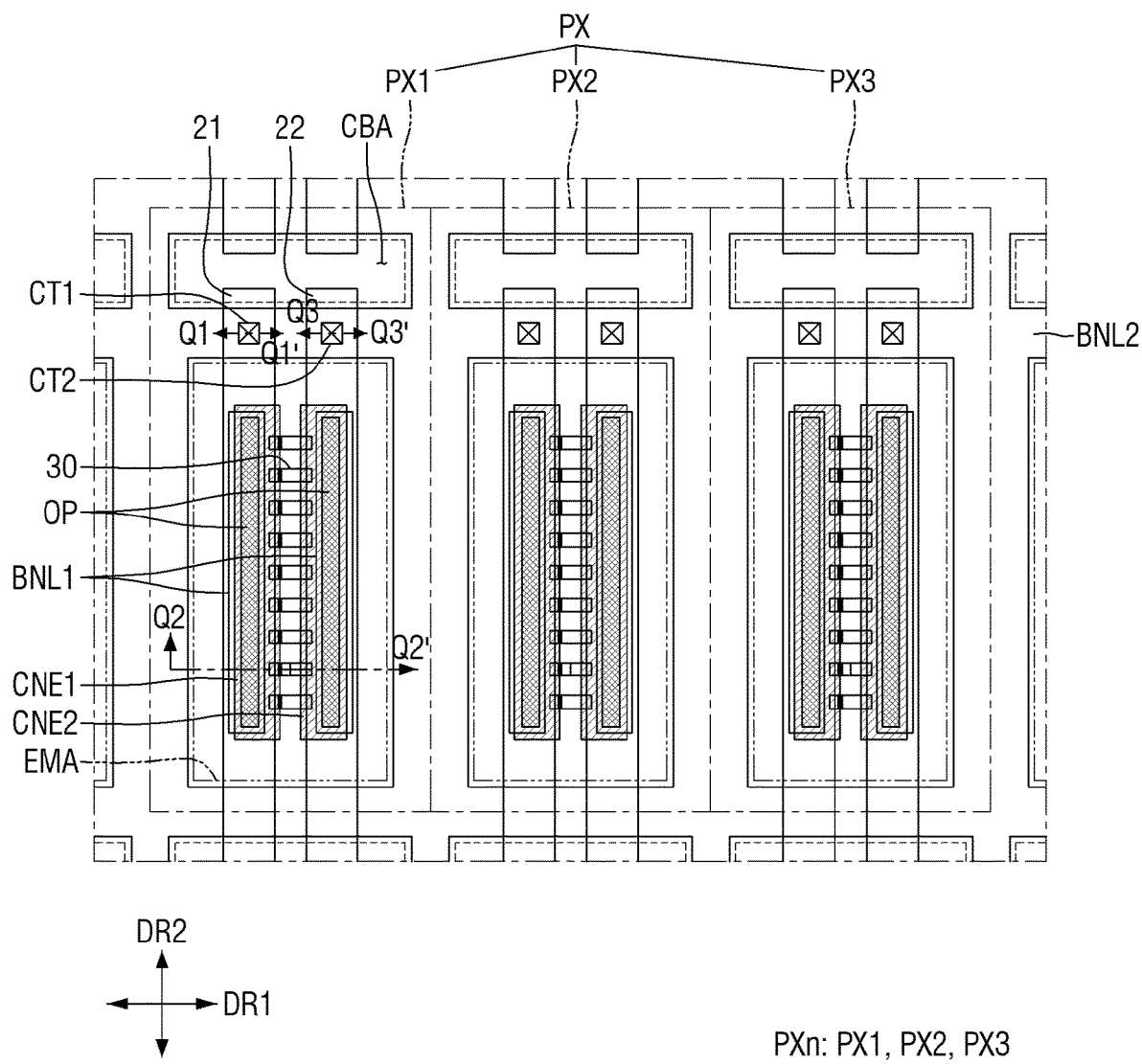
FIG. 2 is a schematic plan view of a pixel of the display device according to an embodiment.

FIG. 2 is a schematic plan view of a pixel of the display device according to an embodiment.

Referring to FIG. 2, each of pixels PX may include subpixels PXn (where n is an integer of 1 to 3). For example, one pixel PX may include first, second, and third subpixels PX1, PX2, and PX3. The first, second, and third subpixels PX1, PX2, and PX3 may emit light of first, second, and third colors, respectively. For example, the first, second, and third colors may be blue, green, and red, respectively, but the disclosure is not limited thereto. Each of the subpixels PXn may emit light of a same color. FIG. 2 illustrates that one pixel PX may include three subpixels PXn, but the disclosure is not limited thereto. As another example, each pixel PX may include more than three subpixels PXn.

Each of the subpixels PXn of the display device 10 may include an emission area EMA and a non-emission area (not illustrated). Emission areas EMA may be areas that include light-emitting elements 30 and emit light of a particular wavelength range, and non-emission areas may be areas that do not include the light-emitting elements 30 and do not output light because of not being reached by light emitted by the light-emitting elements 30. The emission areas EMA may include regions where the light-emitting elements 30 are disposed and regions around the light-emitting elements 30 that output light emitted by the light-emitting elements 30.

However, the disclosure is not limited to this. The emission areas EMA may also include regions that output light emitted from the light-emitting elements 30 and reflected or refracted by other members. Light-emitting elements 30 may be disposed in each of the subpixels PXn and may form an emission area including a region where the light-emitting elements 30 are disposed and a region around the light-emitting elements 30.

Contact electrodes (CNE1 and CNE2), which overlap electrodes (21 and 22) and both sides of each of the light-emitting elements 30, may be disposed in each of the emission areas EMA. The contact electrodes (CNE1 and CNE2) may be connected to the electrodes (21 and 22) through openings OP. The structures of the electrodes (21 and 22) and the contact electrodes (CNE1 and CNE2) will be described later in detail.

Each of the subpixels PXn may include a cut area CBA, which is disposed in the non-emission area. Cut areas CBA may be disposed on sides, in a second direction DR2, of the emission areas EMA. The cut areas CBA may be disposed between the emission areas EMA of two adjacent subpixels PXn in the second direction DR2. Emission areas EMA and cut areas CBA may be arranged in the display area DPA of the display device 10. For example, the emission areas EMA and the cut areas CBA may be repeatedly arranged in a first direction DR1 and may be alternately arranged in the second direction DR2. The distance, in the first direction DR1, between the cut areas CBA may be less than the distance, in the first direction DR1, between the emission areas EMA. A second bank BNL2 may be disposed between the cut areas CBA and between the emission areas EMA, and the distances between the cut areas CBA and between the emission areas EMA may vary depending on the width of the second bank BNL2. As the light-emitting elements 30 are not disposed in the cut areas CBA, the cut areas CBA may not emit light, but parts of the electrodes (21 and 22) of each of the subpixels PXn may be disposed in the cut areas CBA. The electrodes (21 and 22) of each of the subpixels PXn may be separate from one another in the cut areas CBA.

Figure 3:
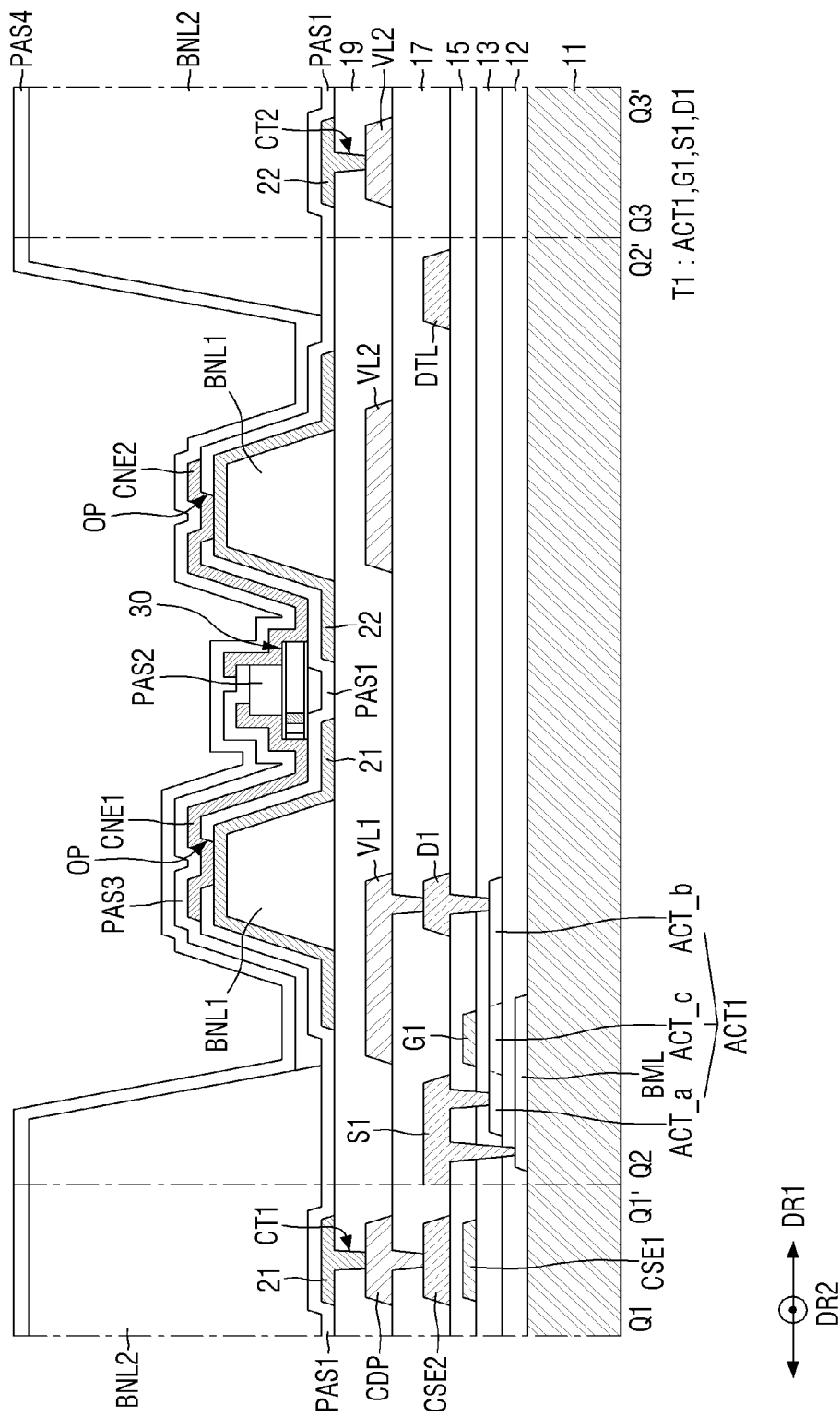
FIG. 3 is a schematic cross-sectional view taken along lines Q1-Q1', Q2-Q2', and Q3-Q3' of FIG. 2.

FIG. 3 is a schematic cross-sectional view taken along lines Q1-Q1', Q2-Q2', and Q3-Q3' of FIG. 2. FIG. 3 is a schematic cross-sectional view taken from one end portion or an end portion to the other end portion or another end portion of a light-emitting element 30 in the first subpixel PX1 of FIG. 2.

Referring to FIG. 3 and further to FIG. 2, the display device 10 may include a substrate 11 and a semiconductor layer, conductive layers, and insulating layers, which are disposed on the substrate 11. The semiconductor layer, the conductive layers, and the insulating layers may form a circuit layer and a light-emitting element layer of the display device 10.

By way of example, the substrate 11 may be an insulating substrate. The substrate 11 may be formed of an insulating material such as glass, quartz, or a polymer resin. The substrate 11 may be a rigid substrate or may be a flexible substrate that is bendable, foldable, or rollable.

A light-blocking layer BML may be disposed on the substrate 11. The light-blocking layer BML may be disposed to overlap an active layer ACT1 of a first transistor T1. The light-blocking layer BML may include a material capable of blocking light and may thus prevent light from being incident upon the active layer ACT1 of the first transistor T1. For example, the light-blocking layer BML may be formed of an opaque metallic material capable of blocking the transmission of light, but the disclosure is not limited thereto. In an embodiment, the light-blocking layer BML may not be provided.

A buffer layer 12 may be disposed not only on the light-blocking layer BML, but also on the entire surface of the substrate 11. The buffer layer 12 may be formed on the substrate 11 to protect the first transistor T1 from moisture that may penetrate the substrate 11, which is susceptible to moisture, and may perform a surface planarization function. The buffer 12 may consist of inorganic layers that may be alternately stacked each other. For example, the buffer layer 12 may be formed as a multilayer film in which inorganic layers including at least one of silicon oxide ($SiO_x$), silicon nitride ($SiN_x$), and silicon oxynitride ($SiO_xN_y$) may be alternately stacked each other.

The semiconductor layer may be disposed on the buffer layer 12. The semiconductor layer may include the active layer ACT1 of the first transistor T1. The semiconductor layer may be disposed to partially overlap a gate electrode G1 in a first gate conductive layer.

FIG. 3 illustrates only the first transistor T1 of the first subpixel PX1, but the number of transistors included in the first subpixel PX1 is not particularly limited. The first subpixel PX1 may include more than one transistor. For example, the first subpixel PX1 may include more than one transistor including the first transistor T1, for example, two or three transistors.

The semiconductor layer may include polycrystalline silicon, monocrystalline silicon, or an oxide semiconductor. In a case where the semiconductor layer may include an oxide semiconductor, the active layer ACT1 may include conductor regions (ACT_a and ACT_b) and a channel region ACT_c between the conductor regions (ACT_a and ACT_b). The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), or indium gallium zinc tin oxide (IGZTO), but the disclosure is not limited thereto.

As another example, the semiconductor layer may include polycrystalline, which is formed by crystallizing amorphous silicon. The conductor regions of the active layer ACT1 may be regions doped with impurities.

A first gate insulating layer 13 is disposed on the semiconductor layer and the buffer layer 12. The first gate insulating layer 13 may be disposed not only on the semiconductor layer, but also on the entire surface of the buffer layer 12. The first gate insulating layer 13 may function as the gate insulating film of each of the transistors of the first subpixel PX1. The first gate insulating layer 13 may be formed of an inorganic material such as, for example, $SiO_x$, $SiN_x$, and $SiO_xN_y$, as an inorganic layer or a stack of such inorganic layers.

The first gate conductive layer is disposed on the first gate insulating layer 13. The first gate conductive layer may include the gate electrode G1 of the first transistor T1 and a first capacitor electrode CSE1 of a storage capacitor. The gate electrode G1 may be disposed to overlap the channel region of the active layer ACT1 in a thickness direction. The first capacitor electrode CSE1 may be disposed to overlap a second capacitor electrode CSE2 in the thickness direction. The first capacitor electrode CSE1 may be connected to, and integral with, the gate electrode G1. The first capacitor electrode CSE1 may be disposed to overlap the second capacitor electrode CSE2 in the thickness direction so that the storage capacitor may be formed between the first capacitor electrode CSE1 and the second capacitor electrode CSE2.

The first gate conductive layer may be formed as a single- or multilayer film including at least one of molybdenum (Mo), aluminum (Al), chromium (Cr), gold (Au), titanium (Ti), nickel (Ni), neodymium (Nd), copper (Cu), and an alloy thereof, but the disclosure is not limited thereto.

A first interlayer insulating layer 15 is disposed on the first gate conductive layer. The first interlayer insulating layer 15 may perform the functions of an insulating film between the first gate conductive layer and other layers disposed thereon. A first interlayer insulating layer 15 may be disposed to cover and protect the first gate conductive layer. The first interlayer insulating layer 15 may be formed of an inorganic material such as, for example, $SiO_x$, $SiN_x$, and $SiO_xN_y$, as an inorganic layer or a stack of such inorganic layers.

A first data conductive layer is disposed on the first interlayer insulating layer 15. The first data conductive layer may include a first source electrode S1, a second drain electrode D1, a data line DTL, and the second capacitor electrode CSE2.

The first source electrode S1 and the first drain electrode D1 of the first transistor T1 may be in contact with the conductor regions (ACT_a and ACT_b) of the active layer ACT1 via contact holes that penetrate the first interlayer insulating layer 15 and the first gate insulating layer 13. The first source electrode S1 of the first transistor T1 may be electrically connected to the light-blocking layer BML via another contact hole penetrating the first interlayer insulating layer 15, the first gate insulating layer 13, and the buffer layer 12.

The data line DTL may transmit a data signal to the other transistors (not illustrated) of the first subpixel PX1. Although not specifically illustrated, the data line DTL may be connected to source or drain electrodes of the other transistors of the first subpixel PX1 and may thus transmit a signal applied thereto to the source or drain electrodes of the other transistors of the first subpixel PX1.

The second capacitor electrode CSE2 is disposed to overlap the first capacitor electrode CSE1 in the thickness direction. For example, the second capacitor electrode CSE2 may be integral with, and connected to, the first source electrode S1.

The first data conductive layer may be formed as a single- or multilayer film including at least one of Mo, Al, Cr, Au, Ti, Ni, Nd, Cu, and an alloy thereof, but the disclosure is not limited thereto.

The second interlayer insulating layer 17 is disposed on the first data conductive layer. The second interlayer insulating layer 17 may function as an insulating film between the first data conductive layer and layers disposed on the first data conductive layer. Also, the second interlayer insulating layer 17 may cover and protect the first data conductive layer. The second interlayer insulating layer 17 may be formed of an inorganic material such as, for example, $SiO_x$, $SiN_x$, and $SiO_xN_y$, as an inorganic layer or a stack of such inorganic layers.

A second data conductive layer may be disposed on the second interlayer insulating layer 17. The second data conductive layer may include a first voltage line VL1, a second voltage line VL2, and a first conductive pattern CDP. A high-potential voltage (or a first power supply voltage) provided to the first transistor T1 may be applied to the first voltage line VL1, and a low-potential voltage (or the second power supply voltage) provided to a second electrode 22 may be applied to the second voltage line VL2. Alignment signals for aligning light-emitting elements 30 may be applied to the second voltage line VL2 during the fabrication of the display device 10.

The first conductive pattern CDP may be connected to the second capacitor electrode CSE2 through a contact hole that is formed in the second interlayer insulating layer 17. The second capacitor electrode CSE2 may be integral with the first source electrode S1, and the first conductive pattern CDP may be electrically connected to the first source electrode S1. The first conductive pattern CDP may be in contact with a first electrode 21, and the first transistor T1 may transmit the first power supply voltage applied thereto from the first voltage line VL1 to the first electrode 21 via the first conductive pattern CDP. FIG. 3 illustrates that the second data conductive layer may include one first voltage line VL1 and one second voltage line VL2, but the disclosure is not limited thereto. The second data conductive layer may include more than one first voltage line VL1 and more than one second voltage line VL2.

The second data conductive layer may be formed as a single- or multilayer film including at least one of Mo, Al, Cr, Au, Ti, Ni, Nd, Cu, and an alloy thereof, but the disclosure is not limited thereto.

A first planarization layer 19 is disposed on the second data conductive layer. The first planarization layer 19 may include an organic insulating material such as polyimide (PI) and may perform a surface planarization function.

First banks BNL1, the electrodes (21 and 22), the light-emitting elements 30, contact electrodes (CNE1 and CNE2), and the second bank BNL2 are disposed on the first planarization layer as elements of a display element layer. Also, insulating layers (PAS1, PAS2, PAS3, and PAS4) may be disposed on the first planarization layer 19.

The first banks BNL1 may be disposed on or directly disposed on the first planarization layer 19. The first banks BNL1 may extend in the second direction DR2 within the first subpixel PX1 and may be disposed within the emission area EMA, instead of extending into neighboring subpixels PXn of the first subpixel PX1 in the second direction DR2. The first banks BNL1 may be disposed to be spaced apart from each other in the first direction DR1, and the light-emitting elements 30 may be disposed between the first banks BNL1. First banks BNL1 may be provided in each of the subpixels PXn to form linear patterns. FIG. 3 illustrates that there are provided two first banks BNL1 in each of the subpixels PXn, but the number of first banks BNL1 is not particularly limited. As another example, more than two first banks BNL1 may be provided depending on the number of electrodes (21 and 22).

The first banks BNL1 may protrude, at least in part, from the top surface of the first planarization layer 19. Parts of the first banks BNL1 that protrude may have inclined sides surfaces, and light emitted from the light-emitting elements 30 may be reflected by the electrodes (21 and 22) on the first banks BNL1 to be emitted in an upward direction from the first planarization layer 19. The first banks BNL1 may not only provide an area in which to arrange the light-emitting elements 30, but also function as a reflecting barrier capable of reflecting light emitted from the light-emitting elements 30 in the upward direction from the first planarization layer 19. The sides of the first banks BNL1 may be linearly inclined, but the disclosure is not limited thereto. As another example, the first banks BNL1 may have a semi-circular or elliptical shape with a curved outer surface. The first banks BNL1 may include an organic insulating material such as PI, but the disclosure is not limited thereto.

The electrodes (21 and 22) are disposed on the first banks BNL1 and the first planarization layer 19. The electrodes (21 and 22) may include the first and second electrodes 21 and 22. The first and second electrodes 21 and 22 may extend in the second direction DR2 and may be spaced apart from each other in the first direction R1.

The first and second electrodes 21 and 22 may extend in the second direction DR2 in the first subpixel PX1 and may be cut and divided in the cut area CBA. For example, the cut area CBA of the first subpixel PX1 may be disposed between the emission area EMA of the first subpixel PX1 and an emission area EMA of a neighboring subpixel PXn adjacent to the first subpixel PX1 in the second direction DR2, and the first and second electrodes 21 and 22 may be cut and divided in the cut area CBA, but the disclosure is not limited thereto. As another example, some or a number of the electrodes (21 and 22) may extend beyond the first subpixel PX1, without being cut and divided in the cut area CBA, or only one of the first and second electrodes 21 and 22 may be cut and divided in the cut area CBA.

The first electrode 21 may be electrically connected to the first transistor T1 via a first contact hole CT1, and the second electrode 22 may be electrically connected to the second voltage line VL2 via a second contact hole CT2. For example, the first electrode 21 may be in contact with the first conductive pattern CDP through the first contact hole CT1, which penetrates the first planarization layer 19 in part of the second bank BNL2 that extends in the first direction DR1, and the second electrode 22 may be in contact with the second voltage line VL2 through the second contact hole CT2, which penetrates the first planarization layer 19 in the part of the second bank BNL2 that extends in the first direction DR1. However, the disclosure is not limited to this example. In another example, the first and second contact holes CT1 and CT2 may be disposed in the emission area EMA, which is surrounded by the second bank BNL2, not to overlap the second bank BNL2.

FIGS. 2 and 3 illustrate that one first electrode 21 and one second electrode 22 are disposed in each of the subpixels PXn, but the disclosure is not limited thereto. For example, more than one first electrode 21 and more than one second electrode 22 may be provided in each of the subpixels PXn. The first and second electrodes 21 and 22 may not necessarily extend in only one direction or a direction, and the shape of the first and second electrodes 21 and 22 may vary. For example, the first and second electrodes 21 and 22 may be curved or bent in part, or one of the first and second electrodes 21 and 22 may be disposed to surround the other electrode.

The first and second electrodes 21 and 22 may be disposed on or directly disposed on the first banks BNL1. The first and second electrodes 21 and 22 may be formed to have a greater width than the first banks BNL1. For example, the first and second electrodes 21 and 22 may be disposed to cover the outer surfaces of the first banks BNL1. The first and second electrodes 21 and 22 may be disposed on side surfaces of the first banks BNL1, and the distance between the first and second electrodes 21 and 22 may be smaller than the distance between the first banks BNL1. The first and second electrodes 21 and 22 may be disposed, at least in part, directly on the first planarization layer 19 and may thus fall on a same plane. However, the disclosure is not limited thereto. As another example, the electrodes (21 and 22) may have a smaller width than the first banks BNL1. The electrodes (21 and 22) may be disposed to cover at least one side surface or a side surface of each of the first banks BNL1 and thus to reflect light emitted from the light-emitting elements 30.

The first and second electrodes 21 and 22 may be formed of a multiferroic body exhibiting multiple ferroic properties at the same time. The multiferroic body is, for example, a material exhibiting at least two ferroic properties from among ferromagnetism, ferroelectricity, and ferroelasticity. The first and second electrodes 21 and 22 may include a multiferroic body having at least ferroelectricity and ferromagnetism. Also, each of the first and second electrodes 21 and 22 may include a multiferroic body exhibiting conductivity and ferromagnetism.

Examples of the multiferroic body include a perovskite multiferroic body such as $PbZr_xTi_{1-x}O_3$ (PZT), $BaTiO_3$, $PbTiO_3$, or $BiFeO_3$ (BFO), a pseudo-ilmenite multiferroic body such as $LiNbO_3$ or $LiTaO_3$, a tungsten-bronze (TB) multiferroic body such as $PbNb_3O_6$ or $Ba_2NaNb_5O_{15}$, a bismuth layered multiferroic body such as $SrBi_2Ta_2O_9$ (SBT), $(Bi, La)_4Ti_3O_{12}$ (BLT), or $Bi_4Ti_3O_{12}$, a pyrochlore multiferroic body such as $La_2Ti_2O_7$, a solid solution of any one of these multiferroic bodies, $RMnO_3$ where R is a rare earth metal such as Tb, Y, Er, Ho, Tm, Yb, or Lu, hexaferrites, $TbMn_2O_5$, and $CoCr_2O_4$. By way of non-limiting example, BFO may be used because of its excellent multiferroic properties even at room temperature. By using a multiferroic oxide, the degradation of the properties of the first and second electrodes 21 and 22 that may be caused by oxidation can be prevented.

In response to an electric field being applied, a magnetic field may be induced and generated in the first and second electrodes 21 and 22, which are formed of the multiferroic body. The first and second electrodes 21 and 22 may generate a magnetic field with an intensity in a range of about 0.10 to about 3.39 emu/g, depending on the material of the first and second electrodes 21 and 22. The magnetic field generated by the first and second electrodes 21 and 22 is converted into a mechanical force in the form of a rotational torque, and as the light-emitting elements 30 are as small as several micrometers, the mechanical force can sufficiently rotate the light-emitting elements 30, even if a magnetic field only having an intensity in a range of about 0.10 to about 3.39 emu/g is generated. Accordingly, the intensity of the magnetic field generated in the multiferroic body, for example, in the first and second electrodes 21 and 22, by applying an external electric field may be in the range of at least 0.10 to about 3.39 emu/g.

Also, the first and second electrodes 21 and 22, which are formed of the multiferroic body, may generate an electric field in response to an external magnetic field being applied thereto. As an external magnetic field is applied to the first and second electrodes 21 and 22, internal polarization may be induced so that an electric field may be generated in the first and second electrodes 21 and 22. Due to the electric field generated in the first and second electrodes 21 and 22, dipole moments of the light-emitting elements 30 may be generated, and the light-emitting elements 30 may be rotated and aligned by a rotational torque $T_{DEP}$, which is generated by the dipole moments of the light-emitting elements 30.

The first and second electrodes 21 and 22, which are formed of the multiferroic body, may include a material exhibiting multiferroic properties at room temperature. The multiferroic body may have a Curie temperature Tc and may exhibit multiferroic properties at a temperature below the Curie temperature Tc. The multiferroic body may have a Curie temperature Tc of about 800° C. or lower to exhibit multiferroic properties during the alignment of the light-emitting elements 30. For example, the Curie temperature Tc of the first and second electrodes 21 and 22 may be in the range of about 100° C. to about 800° C., but the disclosure is not limited thereto. As another example, the Curie temperature Tc of the first and second electrodes 21 and 22 may be in the range of about 200° C. to about 600° C.

The first and second electrodes 21 and 22, which are formed of the multiferroic body, may reflect light emitted from the light-emitting elements 30, in an upward direction. The first and second electrodes 21 and 22 may have a reflectance in a range of about 20 to about 85%.

The light-emitting elements 30 may emit light of a wavelength band in a range of about 400 to about 700 nm. The first and second electrodes 21 and 22 may have a light reflectance in a range of about 20 to about 85% for a wavelength band in a range of about 400 to about 700 nm. For example, $BiFeO_3$, which is a multiferroic material, may have a reflectance of about 33% for a wavelength of about 400 nm and about 23% for a wavelength of about 700 nm. Also, cobalt (Co), Cr, iron (Fe), manganese (Mn), and zinc (Zn) exhibit reflectances of about 58.9%, about 53.2%, about 47.9%, about 52.0%, and about 84.2%, respectively, for a wavelength of about 400 nm. Also, Co, Cr, Fe, Mn, and Zn exhibit reflectances of about 69.9%, about 56.2%, about 54.3%, about 61.6%, and about 87.7%, respectively, for a wavelength of about 700 nm. Accordingly, the multiferroic body, which consists of a compound including at least one of these materials, may have a light reflectance in a range of about 20 to about 85% for a wavelength band in a range of about 400 to about 700 nm.

The electrodes (21 and 22) may be electrically connected to the light-emitting elements 30, and voltages may be applied to the electrodes (21 and 22) so that the light-emitting elements 30 may emit light. The electrodes (21 and 22) may be electrically connected to the light-emitting elements 30 via the contact electrodes (CNE1 and CNE2) and may transmit electrical signals applied thereto to the light-emitting elements 30 via the contact electrodes (CNE1 and CNE2).

One of the first and second electrodes 21 and 22 may be electrically connected to the anode electrodes of the light-emitting elements 30, and the other electrode may be electrically connected to the cathode electrodes of the light-emitting elements 30. However, the disclosure is not limited to this. As another example, one of the first and second electrodes 21 and 22 may be electrically connected to the cathode electrodes of the light-emitting elements 30, and the other electrode may be electrically connected to the anode electrodes of the light-emitting elements 30.

The electrodes (21 and 22) may be used to form an electric field in the first subpixel PX1 to align the light-emitting elements 30. The light-emitting elements 30 may be arranged between the first and second electrodes 21 and 22 by an electric field formed on the first and second electrodes 21 and 22. The light-emitting elements 30 may be sprayed onto the electrodes (21 and 22) via inkjet printing. In case that ink including the light-emitting elements 30 is sprayed on the electrodes (21 and 22), an electric field may be formed by applying alignment signals to the electrodes (21 and 22). The light-emitting elements 30 dispersed in the ink may receive a dielectrophoretic force from the electric field, and as the alignment direction and the location of the light-emitting elements 30 change, the light-emitting elements 30 may be aligned on the electrodes (21 and 22).

A first insulating layer PAS1 may be disposed on the first planarization layer 19. The first insulating layer PAS1 may be disposed to cover the first banks BNL1 and the first and second electrodes 21 and 22. The first insulating layer PAS1 may protect the first and second electrodes 21 and 22 and may insulate the first and second electrodes 21 and 22 from each other. The first insulating layer PAS1 may prevent the light-emitting elements 30, which are disposed on the first insulating layer PAS1, from being in direct contact with, and damaged by, other elements.

In one embodiment, the first insulating layer PAS1 may include openings OP, which expose parts of the first and second electrodes 21 and 22. The openings OP may expose parts of the electrodes (21 and 22) that are disposed on the top surfaces of the first banks BNL1. Parts of the contact electrodes (CNE1 and CNE2) may be in contact with the exposed parts of the electrodes (21 and 22) through the openings OP.

The first insulating layer PAS1 may be formed to have a top surface recessed, in part, between the first and second electrodes 21 and 22. For example, as the first insulating layer PAS1 is disposed to cover the first and second electrodes 21 and 22, the top surface of the first insulating layer PAS1 may be stepped between the first and second electrodes 21 and 22, conforming to the shape of the electrodes (21 and 22) disposed therebelow. However, the disclosure is not limited to this.

The second bank BNL2 may be disposed on the first insulating layer PAS1. In a plan view, the second bank BNL2 may include parts that extend in the first direction DR1 and parts that extend in the second direction DR2 and may thus be arranged in a lattice pattern. The second bank BNL2 may be disposed along the boundaries of each of the subpixels PXn to define each of the subpixels PXn.

Also, the second bank BNL2 may be disposed to surround the emission area EMA and the cut area CBA of each of the subpixels PXn to separate the emission area EMA and the cut area CBA of each of the subpixels PXn. The first and second electrodes 21 and 22 may extend in the second direction DR2 across parts of the second bank BNL2 that extend in the first direction DR1. Parts of the second bank BNL2 that extend in the second direction DR2 may have a greater width between emission areas EMA than between cut areas CBA. Accordingly, the distance between cut areas CBA may be smaller than the distance between emission areas EMA.

The second bank BNL2 may be formed to have a greater height than the first banks BNL1. The second bank BNL2 may prevent ink from spilling over between different subpixels PXn during an inkjet printing process performed as part of the fabrication of the display device 10 and may separate ink having the light-emitting elements 30 dispersed therein between different subpixels PXn to prevent mixture of the ink. The second bank BNL2, like the first banks BNL1, may include polyimide, but the disclosure is not limited thereto.

The light-emitting elements 30 may be disposed on the first insulating layer PAS1. Light-emitting elements 30 may be disposed to be spaced apart from one another in the direction in which the electrodes (21 and 22) extend, for example, in the second direction DR2, and may be aligned substantially in parallel to one another. The light-emitting elements 30 may extend in one direction or a direction, and the direction in which the electrodes (21 and 22) extend may form a substantially right angle with the direction in which the light-emitting elements 30 extend. However, the disclosure is not limited to this. As another example, the light-emitting elements 30 may be arranged not perpendicularly, but diagonally, with respect to the direction in which the electrodes (21 and 22) extend.

The light-emitting elements 30 may include light-emitting layers 36 (of FIG. 4), and the material of the light-emitting layers 36 of the light-emitting elements 30 may differ from one subpixel PXn to another subpixel PXn of each pixel PX so that different subpixels PXn of each pixel PX may emit light of different wavelength ranges. Accordingly, the first, second, and third subpixels PX1, PX2, and PX3 may emit light of the first, second, and third colors, respectively, but the disclosure is not limited thereto. As another example, different subpixels PXn of each pixel PX may include light-emitting elements of a same type and may thus emit light of substantially a same color.

Both end portions of each of the light-emitting elements 30 may be disposed on the electrodes (21 and 22). The length of the light-emitting elements 30 may be greater than the distance between the first and second electrodes 21 and 22, and both end portions of each of the light-emitting elements 30 may be disposed on the first and second electrodes 21 and 22. For example, first end portions of the light-emitting elements 30 may be disposed on the first electrode 21, and second end portions of the light-emitting elements 30 may be disposed on the second electrode 22.

In each of the light-emitting elements 30, layers may be arranged in a direction perpendicular to the top surface of the substrate 11 or the top surface of the first planarization layer 19. The direction in which the light-emitting elements 30 extend may be parallel to the top surface of the first planarization layer 19, and semiconductor layers included in each of the light-emitting elements 30 may be sequentially arranged in a direction parallel to the top surface of the first planarization layer 19. However, the disclosure is not limited to this. As another example, the semiconductor layers may be arranged in the direction perpendicular to the top surface of the first planarization layer 19.

Both end portions of each of the light-emitting elements 30 may be in contact with the contact electrodes (CNE1 and CNE2). For example, an insulating film 38 (of FIG. 4) may not be formed at one end or an end of each of the light-emitting elements 30 so that parts of semiconductor layers 31 and 32 (of FIG. 4) and/or an electrode layer 37 (of FIG. 4) of each of the light-emitting elements 30 may be exposed and may be in contact with the contact electrodes (CNE1 and CNE2), but the disclosure is not limited thereto. As another example, at least part of the insulating film 38 may be removed so that the sides of the semiconductor layers 31 and 32 may be partially exposed. The exposed sides of the semiconductor layers 31 and 32 of each of the light-emitting elements 30 may be in direct contact with the contact electrodes (CNE1 and CNE2).

A second insulating layer PAS2 may be disposed in part on the light-emitting elements 30. For example, the width of the second insulating layer PAS2 may be smaller than the length of the light-emitting elements 30, and the second insulating layer PAS2 may be disposed on the light-emitting elements 30 to surround the light-emitting elements 30 and expose both end portions of each of the light-emitting elements. The second insulating layer PAS2 may be initially disposed to cover the light-emitting elements 30, the electrodes (21 and 22), and the first insulating layer PAS1 during the fabrication of the display device 10 and may be removed to expose both end portions of each of the light-emitting elements 30. The second insulating layer PAS2 may be disposed to extend in the second direction DR2 over the first insulating layer PAS1 and thus to form a linear or island pattern in the first subpixel PX1 in a plan view. The second insulating layer PAS2 may protect the light-emitting elements 30 and may fix the light-emitting elements 30 during the fabrication of the display device 10.

The contact electrodes (CNE1 and CNE2) and a third insulating layer PAS3 may be disposed on the second insulating layer PAS2.

The contact electrodes (CNE1 and CNE2) may extend in one direction or a direction and may be disposed on the electrodes 21 and 22. The contact electrodes (CNE1 and CNE2) may include a first contact electrode CNE1, which is disposed on the first electrode 21, and a second contact electrode CNE2, which is disposed on the second electrode 22. The contact electrodes (CNE1 and CNE2) may be disposed to be spaced apart from, and face, each other. For example, the first and second contact electrodes CNE1 and CNE2 may be disposed on the first and second electrodes 21 and 22, respectively, to be spaced apart from each other in the first direction DR1. The contact electrodes (CNE1 and CNE2) may form stripe patterns in the emission area EMA of the first subpixel PX1.

The contact electrodes (CNE1 and CNE2) may be in contact with the light-emitting elements 30. The first contact electrode CNE1 may be in contact with the first end portions of the light-emitting elements 30, and the second contact electrode CNE2 may be in contact with the second end portions of the light-emitting elements 30. The semiconductor layers of each of the light-emitting elements 30 may be exposed at both ends of the corresponding light-emitting element 30, and the contact electrodes (CNE1 and CNE2) may be in contact with, and electrically connected to, the semiconductor layers of each of the light-emitting elements 30. Sides of the contact electrodes (CNE1 and CNE2) that are in contact with both end portions of each of the light-emitting elements 30 may be disposed on the second insulating layer PAS2. The first contact electrode CNE1 may be in contact with the first electrode 21 through an opening OP that exposes part of the top surface of the first electrode 21, and the second contact electrode CNE2 may be in contact with the second electrode 22 through an opening OP that exposes part of the top surface of the second electrode 22.

The width of the contact electrodes (CNE1 and CNE2) may be smaller than the width of the electrodes (21 and 22). The contact electrodes (CNE1 and CNE2) may be disposed to be in contact with both end portions of each of the light-emitting elements 30 and cover parts of the top surfaces of the first and second electrodes 21 and 22, but the disclosure is not limited thereto. As another example, the contact electrodes (CNE1 and CNE2) may be formed to have a greater width than the electrodes (21 and 22) and thus to cover both sides of each of the electrodes (21 and 22).

The contact electrodes (CNE1 and CNE2) may include a transparent conductive material. For example, the contact electrodes (CNE1 and CNE2) may include ITO, IZO, ITZO, or Al. Light emitted from the light-emitting elements 30 may travel toward the electrodes (21 and 22) through the contact electrodes (CNE1 and CNE2), but the disclosure is not limited thereto.

FIGS. 2 and 3 illustrate that two contact electrodes (CNE1 and CNE2) are provided in each of the subpixels PXn, but the disclosure is not limited thereto. The number of contact electrodes (CNE1 and CNE2) may vary depending on the number of electrodes (21 and 22) disposed in each of the subpixels PXn.

The third insulating layer PAS3 is disposed to cover the first contact electrode CNE1. The third insulating layer PAS3 may be disposed to cover not only the first contact electrode CNE1, but also a side of the second insulating layer PAS2 where the first contact electrode CNE1 is disposed. For example, the third insulating layer PAS3 may be disposed to cover the first contact electrode CNE1 and the first insulating layer PAS1 on the first electrode 21. This type of arrangement may be obtained by forming an insulating material layer for forming the third insulating layer PAS3 on the entire surface of the emission area EMA and partially removing the insulating material layer for forming the third insulating layer PAS3 to form the second contact electrode CNE2. In this process, the insulating material layer for forming the third insulating layer PAS3 may be removed together with an insulating material layer for forming the second contact electrode CNE2, and sides of the second and third insulating layers PAS2 and PAS3 may be aligned with each other. A side of the second contact electrode CNE2 may be disposed on the third insulating layer PAS3, and the second contact electrode CNE2 may be insulated from the first contact electrode CNE1 by the third insulating layer PAS3.

A fourth insulating layer PAS4 may be disposed on the entire surface of the display area DPA of the substrate 11. The fourth insulating layer PAS4 may protect the elements disposed on the substrate 11 from an external environment. The fourth insulating layer PAS4 may not be provided.

The first, second, third, and fourth insulating layers PAS1, PAS2, PAS3, and PAS4 may include an inorganic insulating material or an organic insulating material. For example, the first, second, third, and fourth insulating layers PAS1, PAS2, PAS3, and PAS4 may include an inorganic insulating material such as $SiO_x$, $SiN_x$, $SiO_xN_y$, aluminum oxide ($Al_2O_3$), or aluminum nitride (AlN), but the disclosure is not limited thereto. In another example, the first, second, third, and fourth insulating layers PAS1, PAS2, PAS3, and PAS4 may include an organic insulating material such as an acrylic resin, an epoxy resin, a phenolic resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, or a polymethyl methacrylate-polycarbonate synthetic resin, but the disclosure is not limited thereto.

Figure 4:
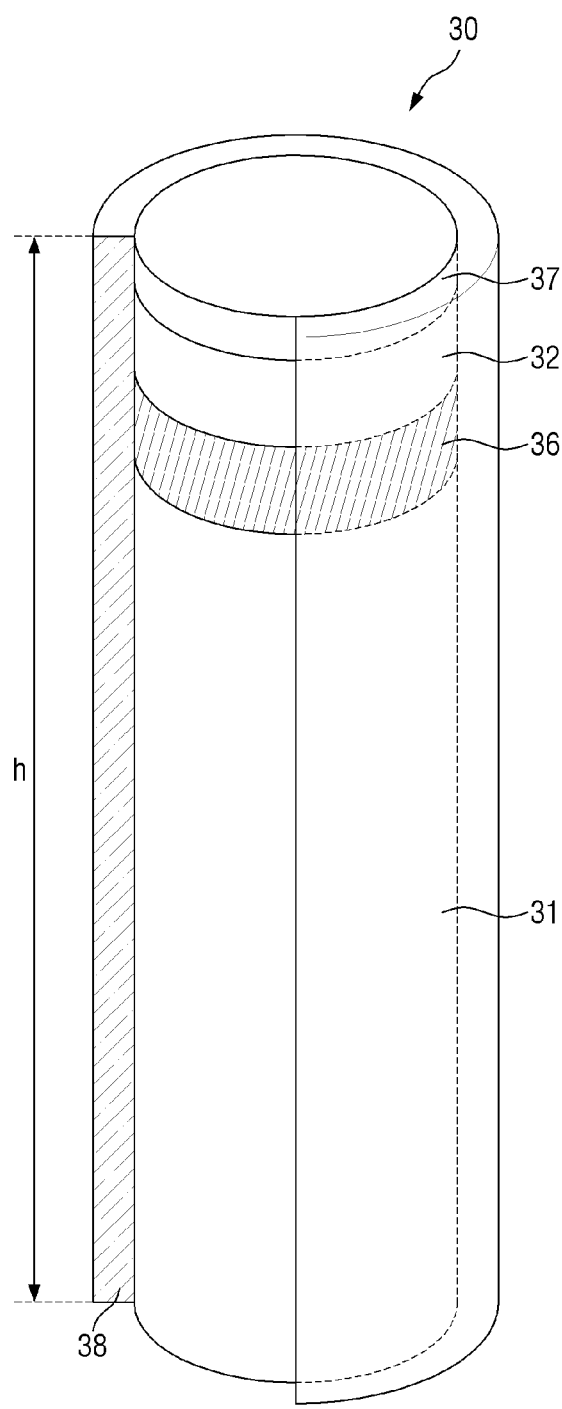
FIG. 4 is a schematic perspective view of a light-emitting element according to an embodiment.

FIG. 4 is a schematic perspective view of a light-emitting element according to an embodiment.

Referring to FIG. 4, a light-emitting element 30 may be a light-emitting diode (LED), by way of non-limiting example, an ILED having a size of several micrometers or nanometers and formed of an inorganic material. If an electric field is formed in a particular direction between two opposite electrodes ("21" and "22" of FIG. 3), the ILED may be aligned between the two electrodes where polarities are formed. The light-emitting element 30 may be aligned by the electric field formed between the two electrodes 21 and 22.

The light-emitting element 30 may have a shape that extends in one direction or a direction. The light-emitting element 30 may have the shape of a cylinder, a rod, a wire, or a tube, but the shape of the light-emitting element 30 is not particularly limited. As another example, the light-emitting element 30 may have the shape of a polygonal column such as a regular cube, a rectangular parallelepiped, or a hexagonal column or may have a shape that extends in one direction or a direction but with a partially inclined outer surface. Semiconductors included in the light-emitting element 30 may be sequentially disposed or stacked in the direction in which the light-emitting element 30 extends.

The light-emitting element 30 may include semiconductor layers doped with impurities of an arbitrary conductivity type (for example, a p type or an n type). The semiconductor layers may receive electrical signals from an external power source to emit light of a particular wavelength range.

As illustrated in FIG. 4, the light-emitting element 30 may include a first semiconductor layer 31, a second semiconductor layer 32, a light-emitting layer 36, an electrode layer 37, and an insulating film 38.

The first semiconductor layer 31 may include an n-type semiconductor. In a case where the light-emitting element 30 emits light of a blue wavelength range, the first semiconductor layer 31 may include a semiconductor material $Al_xGa_yIn_{(1-x-y)}N$ (where $0 \le x \le 1, 0 \le y \le 1$, and $0 \le x+y \le 1$). The semiconductor material $Al_xGa_yIn_{(1-x-y)}N$ may be at least one of AlGaInN, GaN, AlGaN, InGaN, AlN, and InN that are doped with an n-type dopant. The first semiconductor layer 31 may be doped with an n-type dopant, and the n-type dopant may be Si, Ge, or Sn. For example, the first semiconductor layer 31 may be n-GaN doped with n-type Si. The first semiconductor layer 31 may have a length in a range of about 1.5 μm to about 5 μm, but the disclosure is not limited thereto.

The second semiconductor layer 32 is disposed on the light-emitting layer 36. The second semiconductor layer 32 may be a p-type semiconductor. In a case where the light-emitting element 30 emits light of a blue or green wavelength range, the second semiconductor layer 32 may include a semiconductor material $Al_xGa_yIn_{(1-x-y)}N$ (where $0 \le x \le 1, 0 \le y \le 1$, and $0 \le x+y \le 1$). For example, the semiconductor material $Al_xGa_yIn_{(1-x-y)}N$ may be at least one of AlGaInN, GaN, AlGaN, InGaN, AlN, and InN that are doped with a p-type dopant. The second semiconductor layer 32 may be doped with a p-type dopant, and the p-type dopant may be Mg, Zn, Ca, Se, or Ba. For example, the second semiconductor layer 32 may be p-GaN doped with p-type Mg. The second semiconductor layer 32 may have a length in a range of about 0.05 µm to about 0.10 µm, but the disclosure is not limited thereto.

FIG. 4 illustrates that the first and second semiconductor layers 31 and 32 are formed as single-layer films, but the disclosure is not limited thereto. As another example, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 is disposed between the first and second semiconductor layers 31 and 32. The light-emitting layer 36 may include a single- or multi-quantum well structure material. In a case where the light-emitting layer 36 may include a material having a multi-quantum well structure, the light-emitting layer 36 may have a structure in which multiple quantum layers and multiple well layers may be alternately stacked each other. The light-emitting layer 36 may emit light by combining electron-hole pairs in accordance with electrical signals applied thereto via the first and second semiconductor layers 31 and 32. In a case where the light-emitting layer 36 emits light of a blue wavelength range, the quantum layers may include a material such as AlGaN or AlGaInN. By way of example, in a case where the light-emitting layer 36 has a multi-quantum well structure in which multiple quantum layers and multiple well layers may be alternately stacked each other, the quantum layers may include a material such as AlGaN or AlGaInN, and the well layers may include a material such as GaN or AlInN. For example, in a case where the light-emitting layer 36 may include AlGaInN as its quantum layer(s) and AlInN as its well layer(s), the light-emitting layer 36 can emit blue light having a central wavelength range of about 450 nm to about 495 nm.

However, the disclosure is not limited to this. As another example, the light-emitting layer 36 may have a structure in which a semiconductor material having a large band gap energy and a semiconductor material having a small band gap energy may be alternately stacked each other or may include group-III or group-V semiconductor materials depending on the wavelength of light to be emitted. The type of light emitted by the light-emitting layer 36 is not particularly limited. The light-emitting layer 36 may emit light of a red or green wavelength range as necessary, instead of blue light. The light-emitting layer 36 may have a length in a range of about 0.05 µm to about 0.10 µm, but the disclosure is not limited thereto.

Light may be emitted not only from the circumferential surface, in a length direction, of the light-emitting element 30, but also from both sides of the light-emitting element 30. The direction in which light is emitted from the light-emitting layer 36 is not particularly limited.

Figure 5:
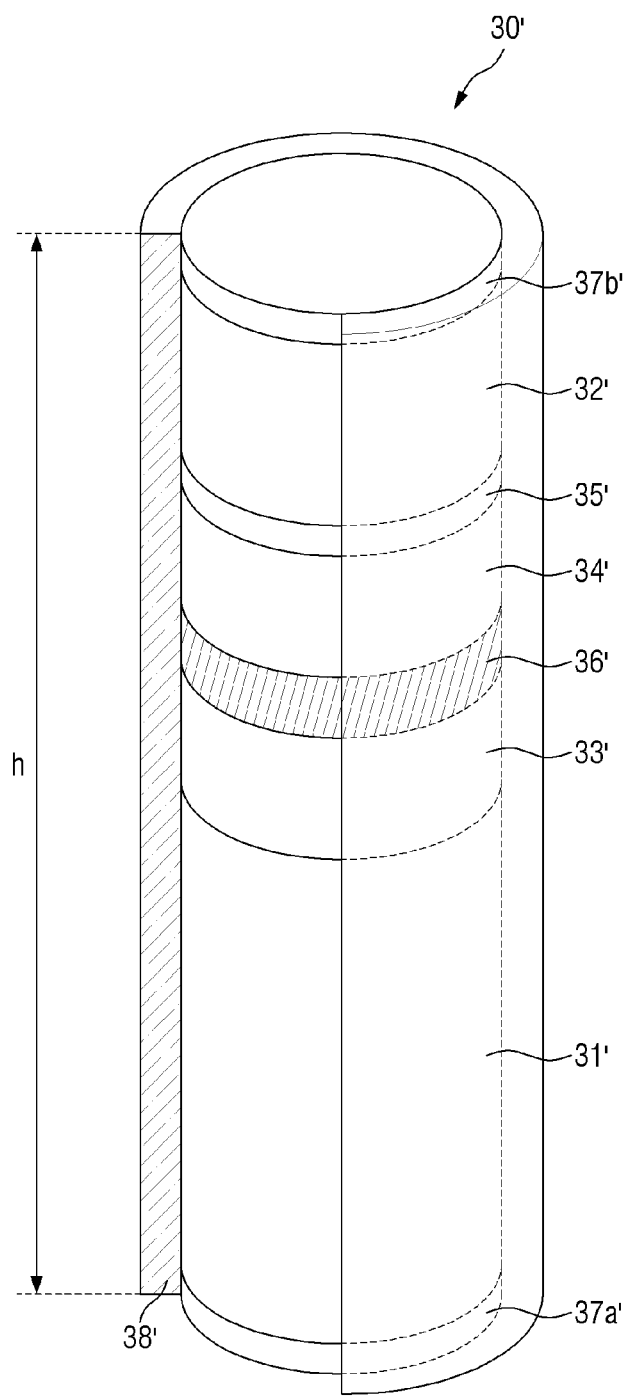
FIG. 5 is a schematic perspective view of a light-emitting element according to an embodiment.

FIG. 5 is a schematic perspective view of a light-emitting element according to an embodiment.

Referring to FIG. 5, a light-emitting element 30' may include a first semiconductor layer 31', a second semiconductor layer 32', and a light-emitting layer 36' and may further include a third semiconductor layer 33', which is disposed between the first semiconductor layer 31' and the light-emitting layer 36', and fourth and fifth semiconductor layers 34' and 35', which are disposed between the light-emitting layer 36' and the second semiconductor layer 32'. The light-emitting element 30' differs from the light-emitting element 30 of FIG. 4 in that it may include semiconductor layers (33', 34', and 35') and electrode layers (37a' and 37b'), and that the light-emitting layer 36' may include a different element or material from the light-emitting layer 36 of FIG. 4. The light-emitting element 30' will hereinafter be described, focusing on the differences with the light-emitting element 30 of FIG. 4. FIG. 5 may further include an insulating film 38'.

The light-emitting layer 36 of the light-emitting element 30 of FIG. 4 may include nitrogen (N) and may thus emit blue or green light. On the contrary, the light-emitting layer 36' and the semiconductor layers (33', 34', and 35') of the light-emitting element 30' of FIG. 5 may include a semiconductor that contains at least phosphorus (P). The light-emitting element 30' may emit red light having a central wavelength range of about 620 nm to about 750 nm. However, the central wavelength range of the red light is not particularly limited and may be understood as encompassing all wavelength ranges that can be perceived as red light.

By way of example, the first semiconductor layer 31' may be an n-type semiconductor layer including a semiconductor material $In_xAl_yGa_{(1-x-y)}P$ (where $0 \le x \le 1, 0 \le y \le 1$, and $0 \le x+y \le 1$). The first semiconductor layer 31' may include at least one of InAlGaP, GaP, AlGaP, InGaP, AlP, and InP that are doped with an n-type dopant. For example, the first semiconductor layer 31' may be n-AlGaInP doped with n-type Si.

The second semiconductor layer 32' may be a p-type semiconductor layer including a semiconductor material $In_xAl_yGa_{(1-x-y)}P$ (where $0 \le x \le 1, 0 \le y \le 1$, and $0 \le x+y \le 1$). The second semiconductor layer 32' may include at least one of InAlGaP, GaP, AlGaNP, InGaP, AlP, and InP that are doped with a p-type dopant. For example, the second semiconductor layer 32' may be p-GaP doped with p-type magnesium (Mg).

The light-emitting layer 36' may be disposed between the first and second semiconductor layers 31' and 32'. The light-emitting layer 36' may include a single- or multi-quantum well structure material and may thus emit light of a particular wavelength range. In a case where the light-emitting layer 36' has a structure in which a quantum layer and a well layer may be alternately stacked each other to form a multi-quantum well structure, the quantum layer may include a material such as AlGaP or AlInGaP, and the well layer may include a material such as GaP or AlInP. For example, the light-emitting layer 36' may include AlGaInP as the quantum layer and AlInP as the well layer and may thus emit red light having a central wavelength range of about 620 nm to about 750 nm.

The light-emitting element 30' of FIG. 5 may further include clad layers, which are disposed adjacent to the light-emitting layer 36'. The third and fourth semiconductor layers 33' and 34', which are disposed between the first and second semiconductor layers 31' and 32', above or below the light-emitting layer 36', may be clad layers.

The third semiconductor layer 33' may be disposed between the first semiconductor layer 31' and the light-emitting layer 36'. The third semiconductor layer 33', like the first semiconductor layer 31', may be an n-type semiconductor layer and may include a semiconductor material $In_xAl_yGa_{(1-x-y)}P$ (where $0 \le x \le 1, 0 \le y \le 1$, and $0 \le x+y \le 1$). For example, the first semiconductor layer 31' may include n-AlGaInP, and the third semiconductor layer 33' may include n-AlInP. However, the disclosure is not limited to this example.

The fourth semiconductor layer 34' may be disposed between the light-emitting layer 36' and the second semiconductor layer 32'. The fourth semiconductor layer 34' may include a semiconductor material $In_xAl_yGa_{(1-x-y)}P$ (where $0 \le x \le 1, 0 \le y \le 1$, and $0 \le x+y \le 1$). For example, the second semiconductor layer 32' may include p-GaP, and the fourth semiconductor layer 34' may include p-AlInP.

The fifth semiconductor layer 35' may be disposed between the second and fourth semiconductor layers 32' and 34'. The fifth semiconductor layer 35', like the second and fourth semiconductor layers 32' and 34', may be a p-type semiconductor layer. In an embodiment, the fifth semiconductor layer 35' may reduce the difference in lattice constant between the second and fourth semiconductor layers 32' and 34'. The fifth semiconductor layer 35' may be a tensile strain barrier reducing (TSBR) layer. For example, the fifth semiconductor layer 35' may include p-GaInP, p-AlInP, or p-AlGaInP, but the disclosure is not limited thereto. The third, fourth, and fifth semiconductor layers 33', 34', and 35' may have a length in a range of about 0.08 μm to about 0.25 μm, but the disclosure is not limited thereto.

First and second electrode layers 37a' and 37b' may be disposed on the first and second semiconductor layers 31' and 32'. The first electrode layer 37a' may be disposed on the bottom surface of the first semiconductor layer 31', and the second electrode layer 37b' may be disposed on the top surface of the second semiconductor layer 32'. However, the disclosure is not limited to this, and at least one of the first and second electrode layers 37a' and 37b' may not be omitted. For example, the first electrode layer 37a' may not be disposed on the bottom surface of the first semiconductor layer 31', and only the second electrode layer 37b' may be disposed on the top surface of the second semiconductor layer 32'.

Referring again to FIG. 3, the electrode layer 37 may be an ohmic contact electrode, but the disclosure is not limited thereto. As another example, the electrode layer 37 may be a Schottky contact electrode. The light-emitting element 30 may include at least one electrode layer 37. FIG. 4 illustrates that the light-emitting element 30 may include one electrode layer 37, but the disclosure is not limited thereto. As another example, the light-emitting element 30 may include more than one electrode layer 37, or the electrode layer 37 may not be provided. However, the following description of the light-emitting element 30 may also be directly applicable to a light-emitting element 30 having more than one electrode layer 37 or having a different structure from the light-emitting element 30 of FIG. 4.

The electrode layer 37 may reduce the resistance between the light-emitting element 30 and electrodes (or contact electrodes) in case that the light-emitting element 30 is electrically connected to the electrodes (or the contact electrodes). The electrode layer 37 may include a conductive metal. For example, the electrode layer 37 may include at least one of Al, Ti, In, Au, Ag, ITO, IZO, and ITZO. Also, the electrode layer 37 may include a semiconductor material doped with an n- or p-type dopant. The electrode layer 37 may include a same material or a similar material or different materials, but the disclosure is not limited thereto.

The insulating film 38 is disposed to surround the first and second semiconductor layers 31 and 32 and the electrode layer 37. For example, the insulating film 38 may be disposed to surround at least the light-emitting layer 36 and may extend in the direction in which the light-emitting element 30 extends. The insulating film 38 may protect the first semiconductor layer 31, the light-emitting layer 36, the second semiconductor layer 32, and the electrode layer 37. For example, the insulating film 38 may be formed to surround the sides of the first semiconductor layer 31, the light-emitting layer 36, the second semiconductor layer 32, and the electrode layer 37, but to expose both end portions, in the length direction, of the light-emitting element 30.

FIG. 4 illustrates that the insulating film 38 is formed to extend in the length direction of the light-emitting element 30 and to cover the sides of the first semiconductor layer 31, the light-emitting layer 36, the second semiconductor layer 32, and the electrode layer 37, but the disclosure is not limited thereto. The insulating film 38 may cover the sides of only the light-emitting layer 36 and some or a number of the first and second semiconductor layers 31 and 32 or may cover only part of the side of the electrode layer 37 so that the side of the electrode layer 37 may be partially exposed. The insulating film 38 may be formed to be rounded in a cross-sectional view, in a region adjacent to at least one end or an end of the light-emitting element 30.

The insulating film 38 may have a thickness in a range of about 10 nm to about 1.0 μm, but the disclosure is not limited thereto. For example, the insulating film 38 may have a thickness of about 40 nm.

The insulating film 38 may include a material with insulating properties such as, for example, at least one selected from among $SiO_x$, $SiN_x$, $SiO_xN_y$, AlN, and $Al_2O_3$ and may be formed as a single-layer film or a multilayer film. Accordingly, the insulating film 38 can prevent any short circuit that may occur in case that the light-emitting layer 36 is placed in direct contact with electrodes that transmit electrical signals directly to the light-emitting element 30. Also, as the insulating film 38 may include the light-emitting layer 36 to protect the outer surface of the light-emitting element 30, any degradation in the emission efficiency of the light-emitting element 30 can be prevented.

The outer surface of the insulating film 38 may be subjected to surface treatment. The light-emitting element 30 may be sprayed on electrodes in a state of being dispersed in an ink. Here, the surface of the insulating film 38 may be hydrophobically or hydrophilically treated to keep the light-emitting element 30 dispersed in ink without agglomerating with other neighboring light-emitting elements 30. For example, the insulating film 38 may be surface-treated with a material such as stearic acid or 2,3-naphthalene dicarboxylic acid.

A length h of the light-emitting element 30 may be in the range of about 1 μm to about 10 μm or about 2 μm to about 6 μm, and for example, about 3 μm to about 5 μm. The light-emitting element 30 may have a diameter in a range of about 30 nm to about 700 nm and may have an aspect ratio in a range of about 1.2 to about 100, but the disclosure is not limited thereto. Different light-emitting elements 30 included in the display device 10 may have different diameters depending on the composition of their respective light-emitting layers 36. By way of example, the light-emitting element 30 may have a diameter of about 500 nm.

The shape and the material of the light-emitting element 30 are not particularly limited. In an embodiment, the light-emitting element 30 may include more layers than those illustrated in FIG. 4 or may have a different shape from that illustrated in FIG. 4.

A method of manufacturing the display device 10 will hereinafter be described.

Figure 6:
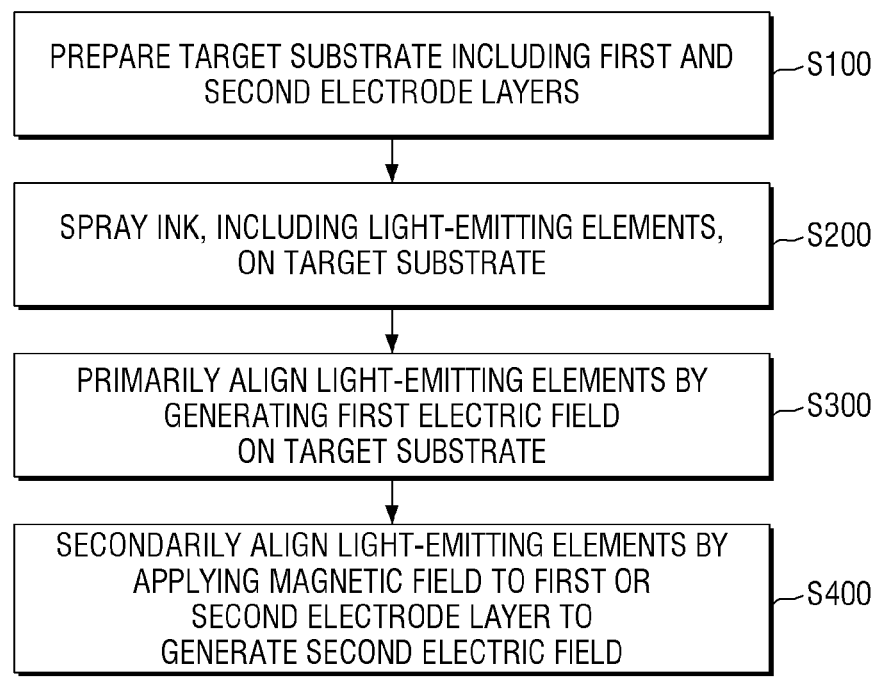
FIG. 6 is a flowchart illustrating a method of manufacturing the display device according to an embodiment.
Figure 7:
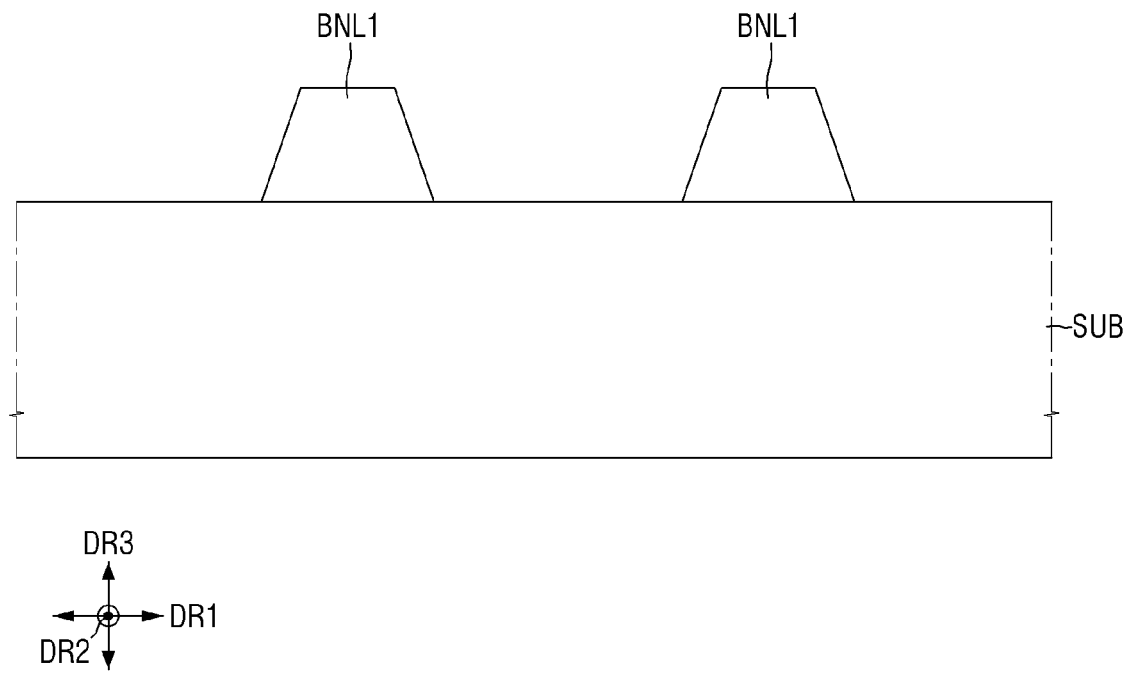
FIGS. 7 and 8 are schematic cross-sectional views illustrating manufacturing processes of the method of manufacturing the display device according to an embodiment.
Figure 8:
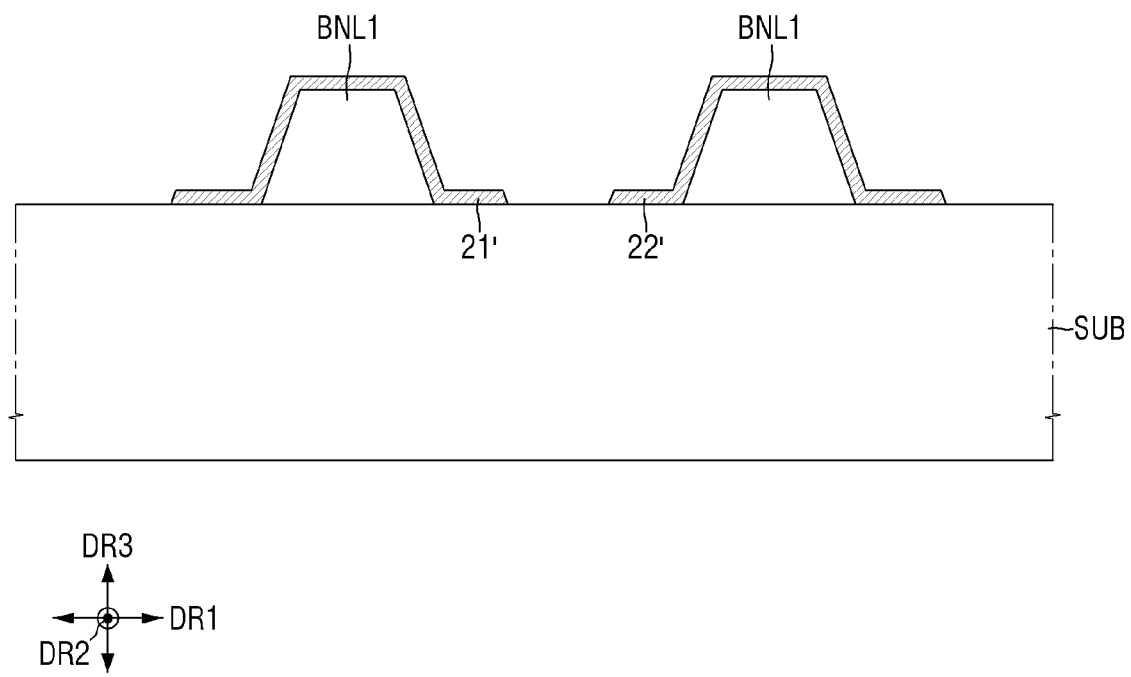
Figure 9:
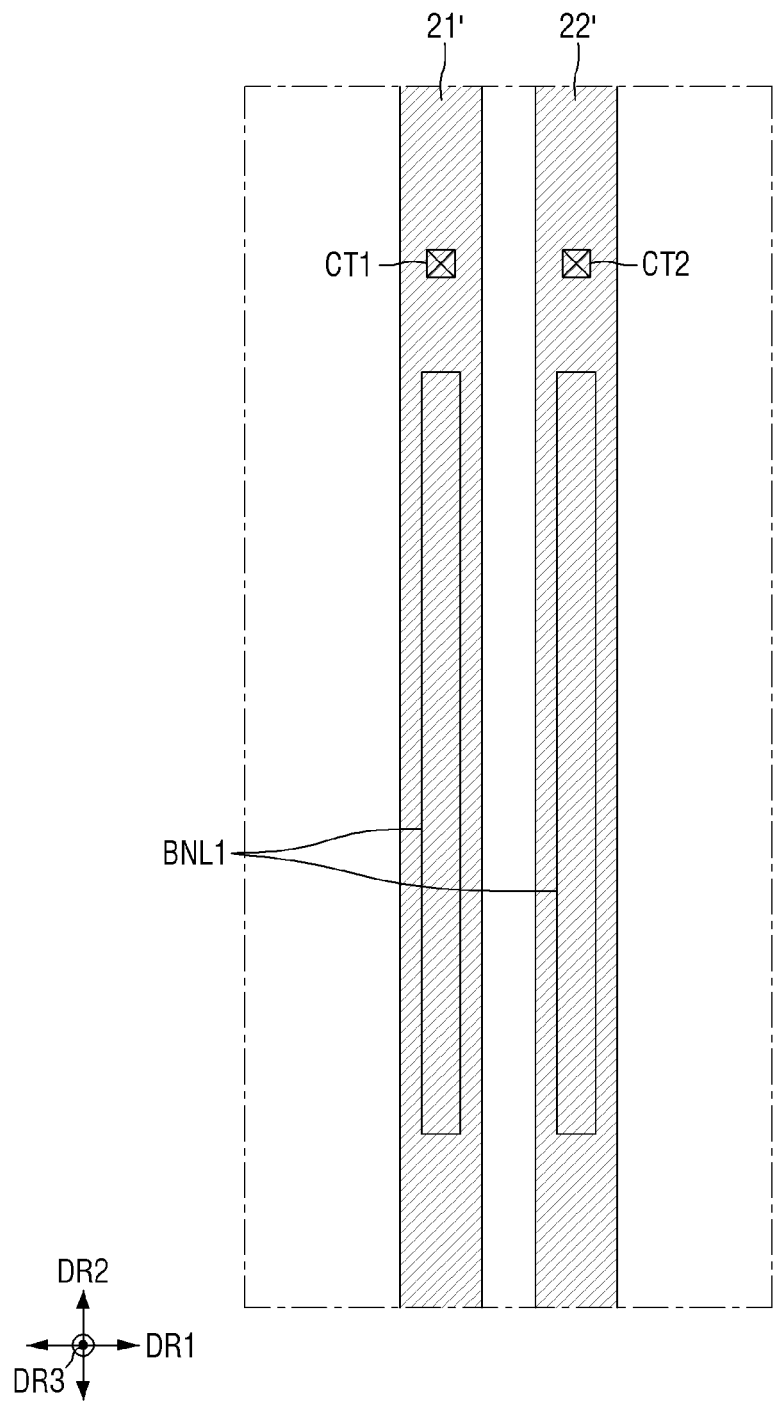
FIG. 9 is a schematic plan view of a subpixel during the manufacturing process illustrated in FIG. 8.

FIG. 6 is a flowchart illustrating a method of manufacturing the display device according to an embodiment. FIGS. 7 and 8 are schematic cross-sectional views illustrating manufacturing processes of the method of manufacturing the display device according to an embodiment. FIG. 9 is a schematic plan view of a subpixel during the manufacturing process illustrated in FIG. 8.

Referring to FIG. 6, the method of manufacturing the display device according to an embodiment may include: preparing a target substrate SUB including first and second electrode layers 21' and 22' (S100); spraying ink IN including light-emitting elements 30 onto the target substrate SUB (S200); primarily aligning the light-emitting elements 30 on the target substrate SUB by generating a first electric field on the target substrate SUB (S300); and secondarily aligning the light-emitting elements 30 on the target substrate SUB by applying a magnetic field to the first and second electrode layers 21' and 22' to generate a second electric field (S400). The method of manufacturing the display device according to an embodiment will hereinafter be described with reference further to FIG. 6.

First, referring to FIG. 7, the target substrate SUB is prepared. Although not specifically illustrated, the target substrate SUB may include the substrate 11 and circuit elements, which consist of conductive layers and insulating layers. For convenience, the substrate 11 and the circuit elements are simply illustrated as the target substrate SUB.

Thereafter, first banks BNL1, which are spaced apart from each other, are formed on the target substrate SUB. The first banks BNL1 may protrude from the top surface of the target substrate SUB, as already mentioned above.

Thereafter, referring to FIGS. 8 and 9, the first and second electrode layers 21' and 22', which are disposed on the first banks BNL1, are formed. The first and second electrode layers 21' and 22' extend in the second direction DR2 and may be spaced apart from each other. The first and second electrode layers 21' and 22' may extend in the second direction DR2 and may be disposed in multiple subpixels PXn during the fabrication of the display device 10. The cutting of the first and second electrode layers 21' and 22' may be performed in a cut area CBA of each subpixel PXn after the alignment of the light-emitting elements 30, and as a result, first and second electrodes 21 and 22 may be formed. The first and second electrode layers 21' and 22' may be in contact with the circuit elements through first and second contact holes CT1 and CT2, which are formed in the target substrate SUB.

Figure 10:
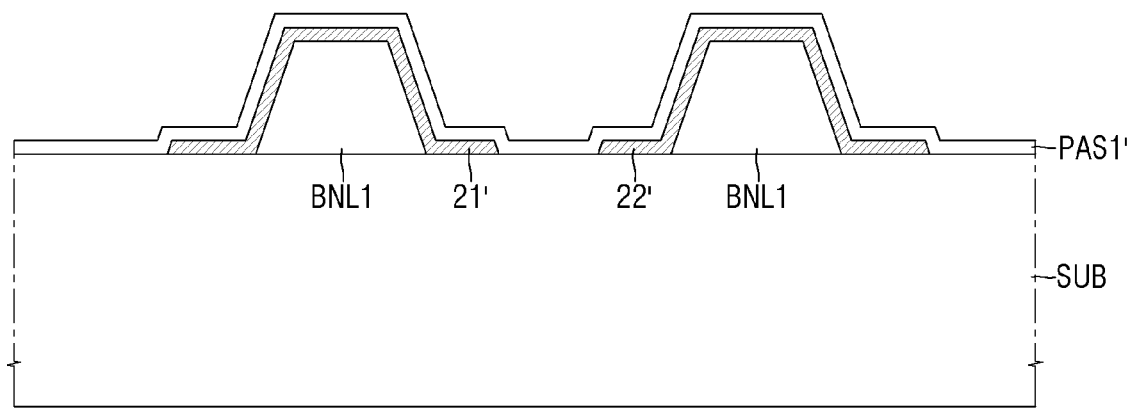
FIGS. 10 and 11 are schematic cross-sectional views illustrating manufacturing processes of the method of manufacturing the display device according to an embodiment.
Figure 11:
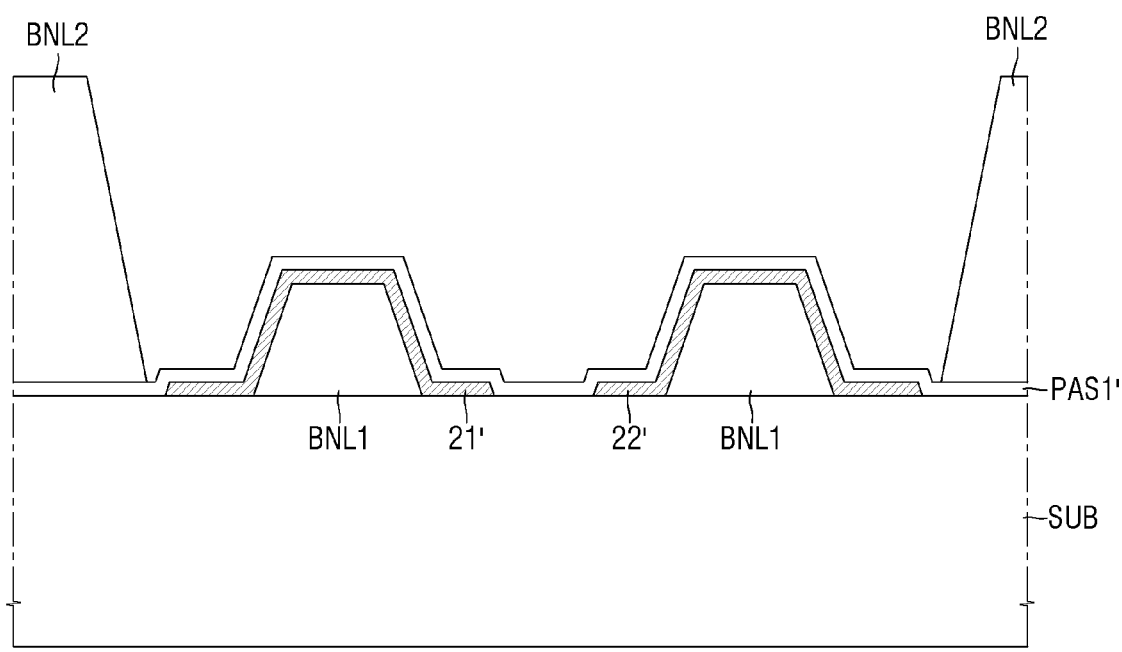
Figure 12:
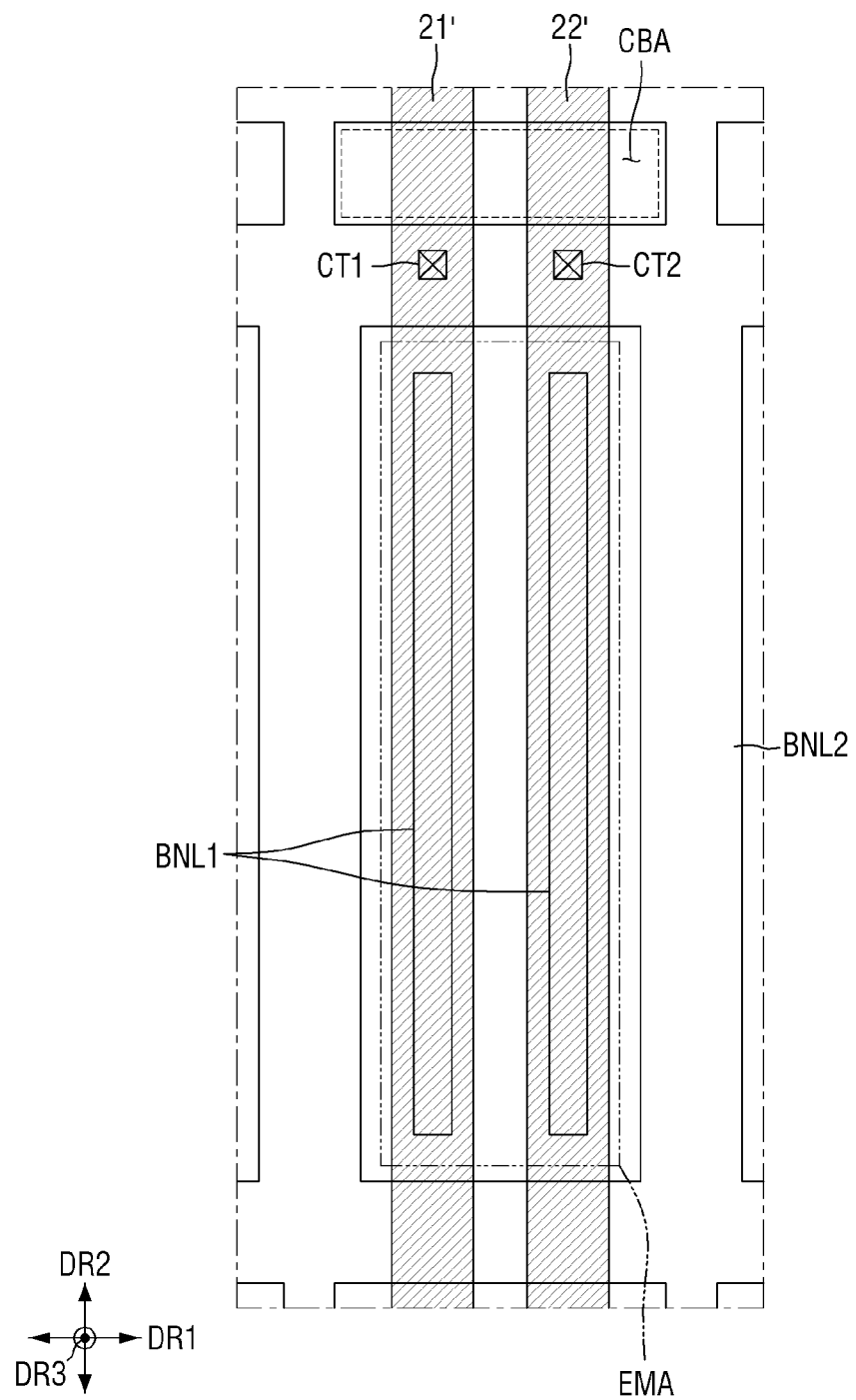
FIG. 12 is a schematic plan view of a subpixel during the manufacture of the display device according to an embodiment.

FIGS. 10 and 11 are schematic cross-sectional views illustrating manufacturing processes of the method of manufacturing the display device according to an embodiment. FIG. 12 is a schematic plan view of a subpixel during the manufacture of the display device according to an embodiment.

Referring to FIGS. 10 through 12, a first insulating material layer PAS1', which covers the first and second electrode layers 21' and 22', is formed, and a second bank BNL2, which is disposed on the first insulating material layer PAS1' and surrounds an emission area EMA and the cut area of each subpixel PXn, is formed. The first insulating material layer PAS1' may be disposed on the entire surface of the target substrate SUB and may cover electrode layers (21' and 22'). The first insulating material layer PAS1' may be partially removed later to expose the top surfaces of the electrode layers (21' and 22'), and as a result, a first insulating layer PAS may be formed. The second bank BNL2 may be disposed to surround, and define and separate, each subpixel PXn and to define and separate the emission area EMA and the cut area CBA, as already mentioned above.

Figure 13:
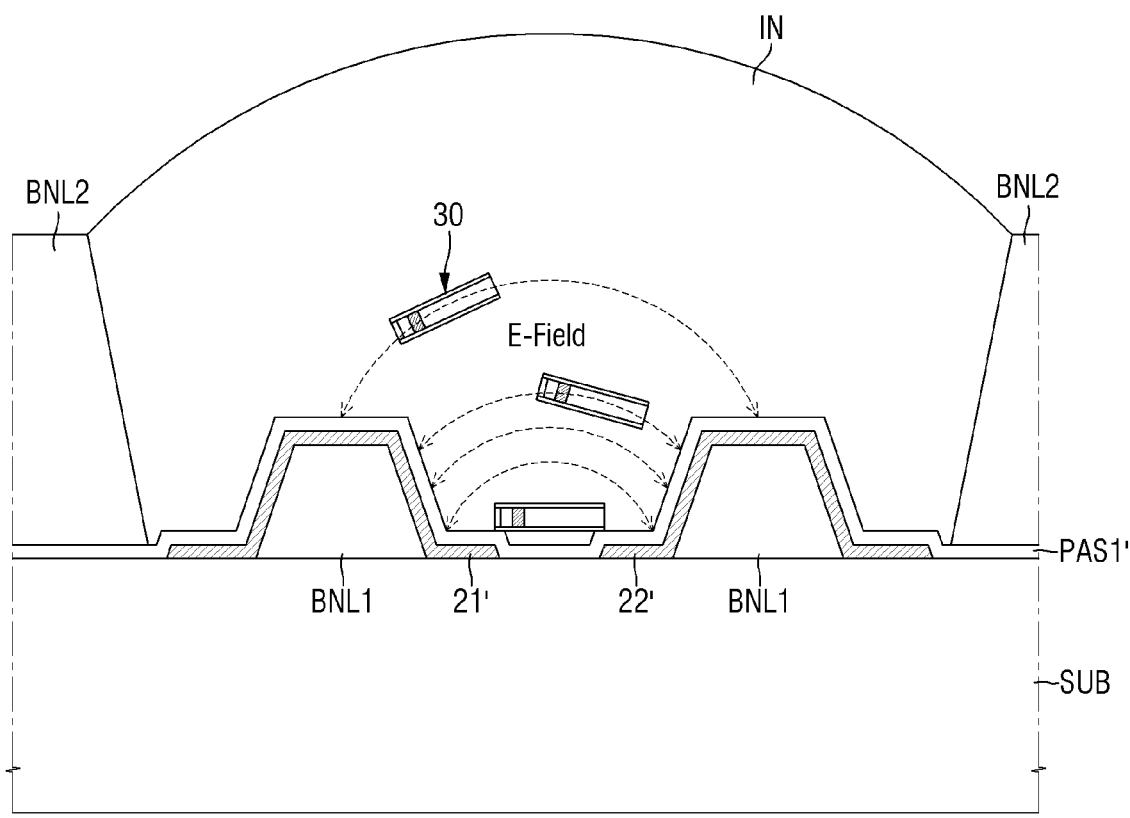
FIG. 13 is a schematic cross-sectional view illustrating the layout of light-emitting elements during the manufacture of the display device according to an embodiment.
Figure 14:
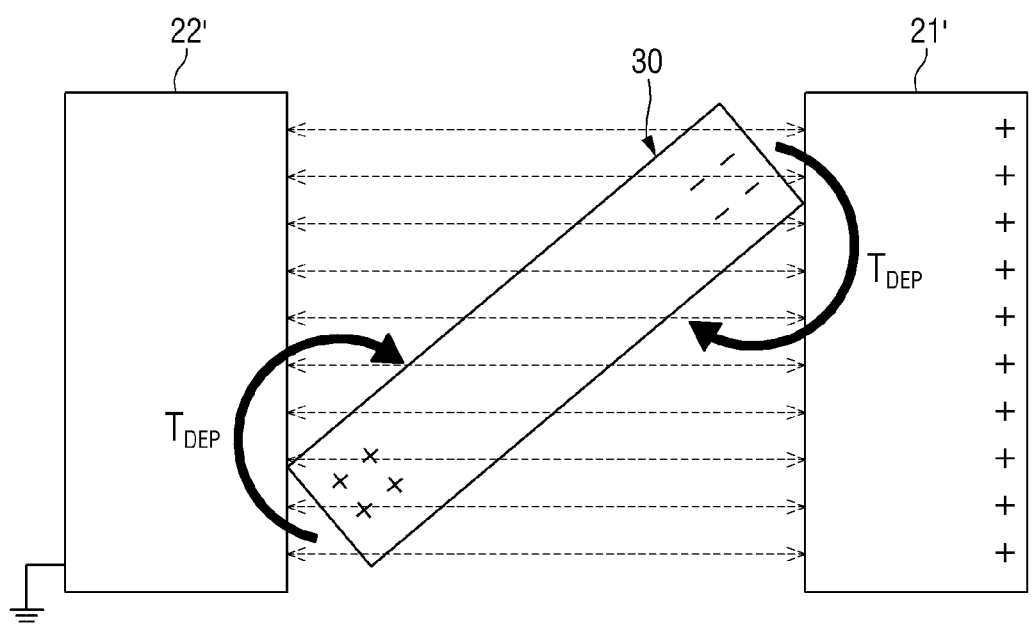
FIG. 14 is a schematic view illustrating how a light-emitting element is arranged during the manufacture of the display device according to an embodiment.
Figure 15:
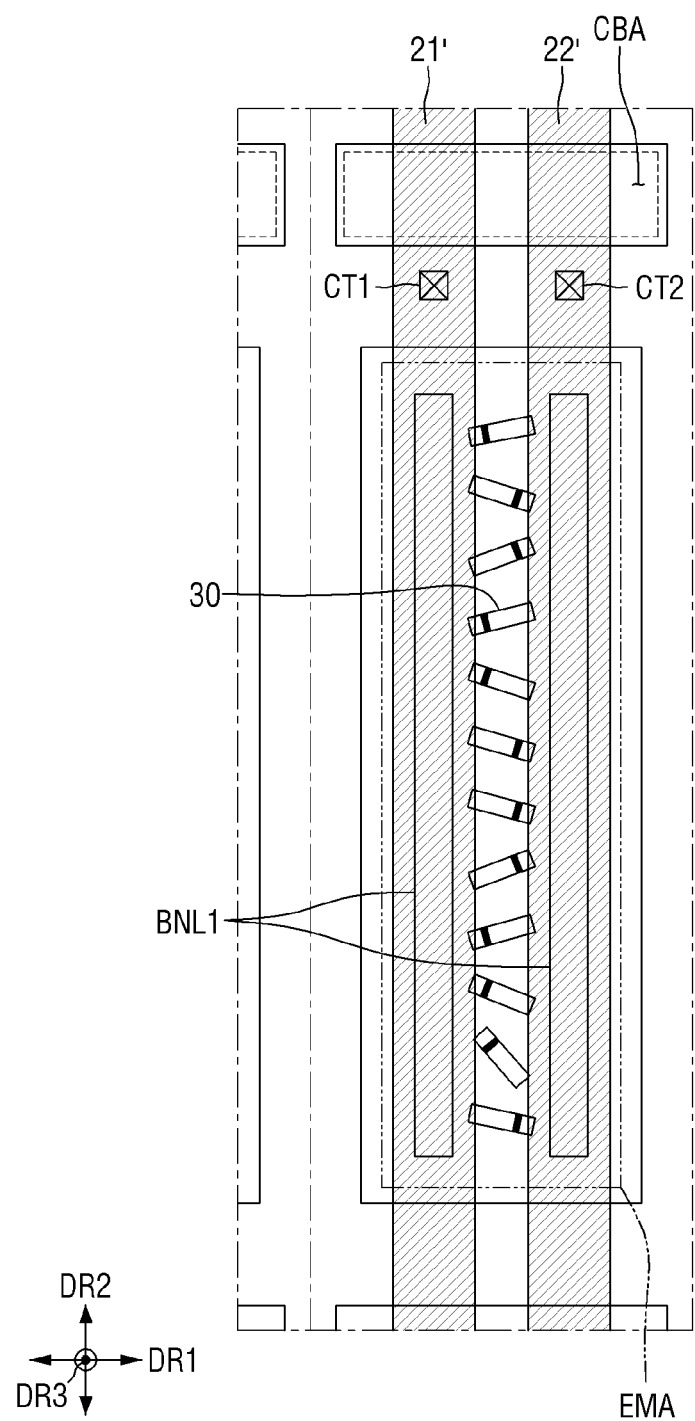
FIG. 15 is a schematic plan view of a subpixel during the manufacture of the display device according to an embodiment.
Figure 16:
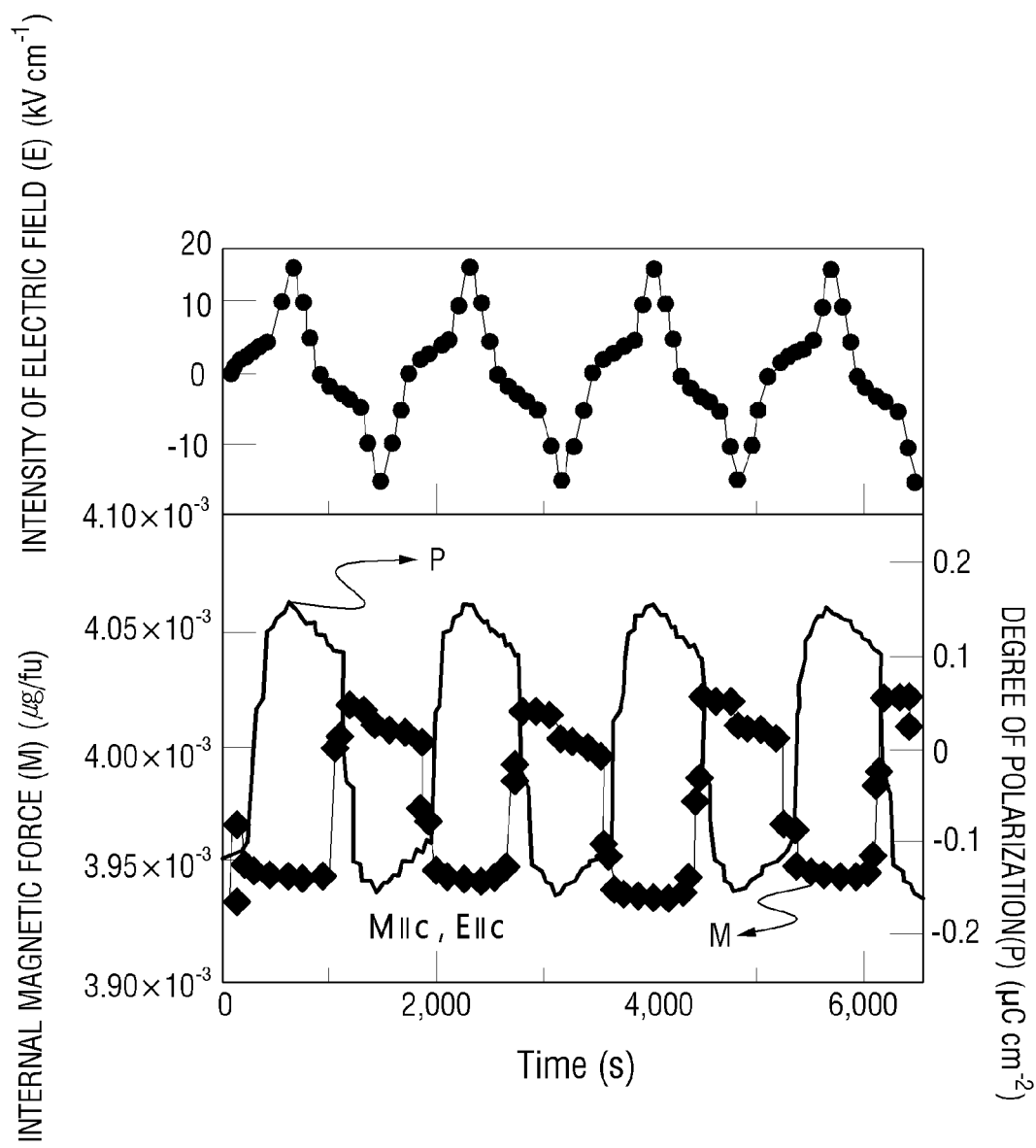
FIG. 16 is a graph showing the effect of a converse electric field-magnetic field of a multiferroic body.
Figure 17:
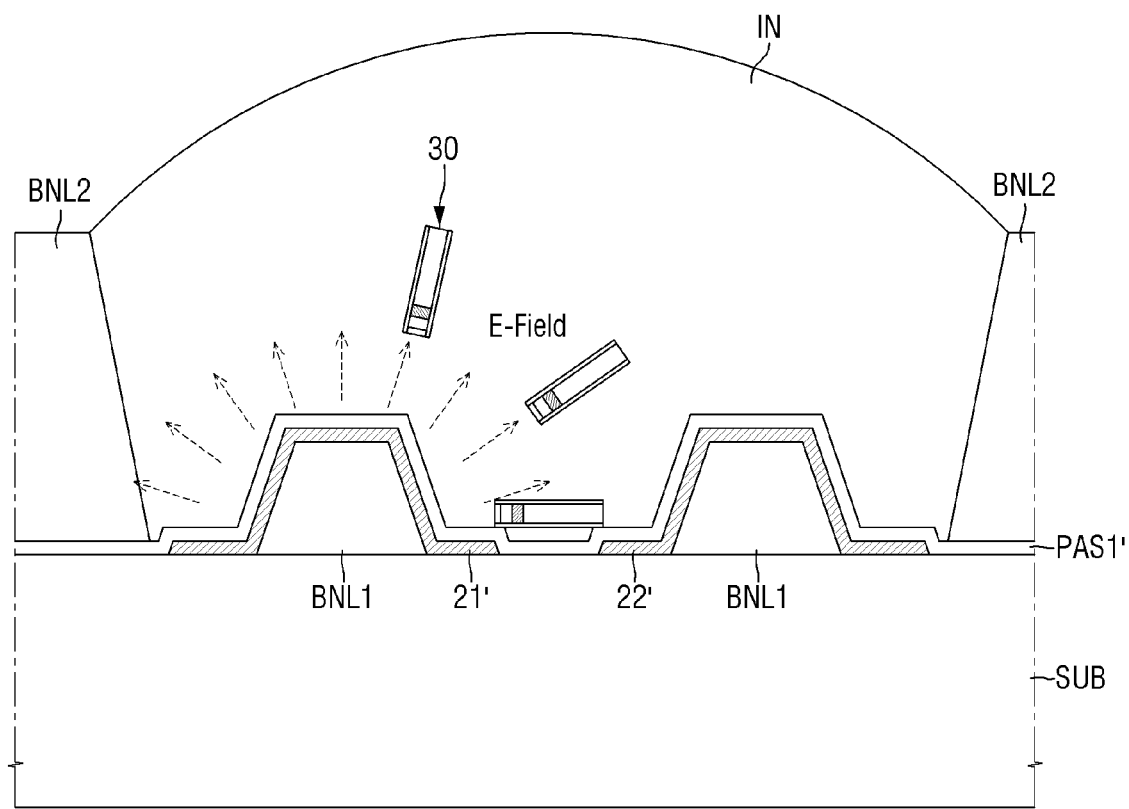
FIG. 17 is a schematic cross-sectional view illustrating the layout of light-emitting elements during the manufacture of the display device according to an embodiment.
Figure 18:
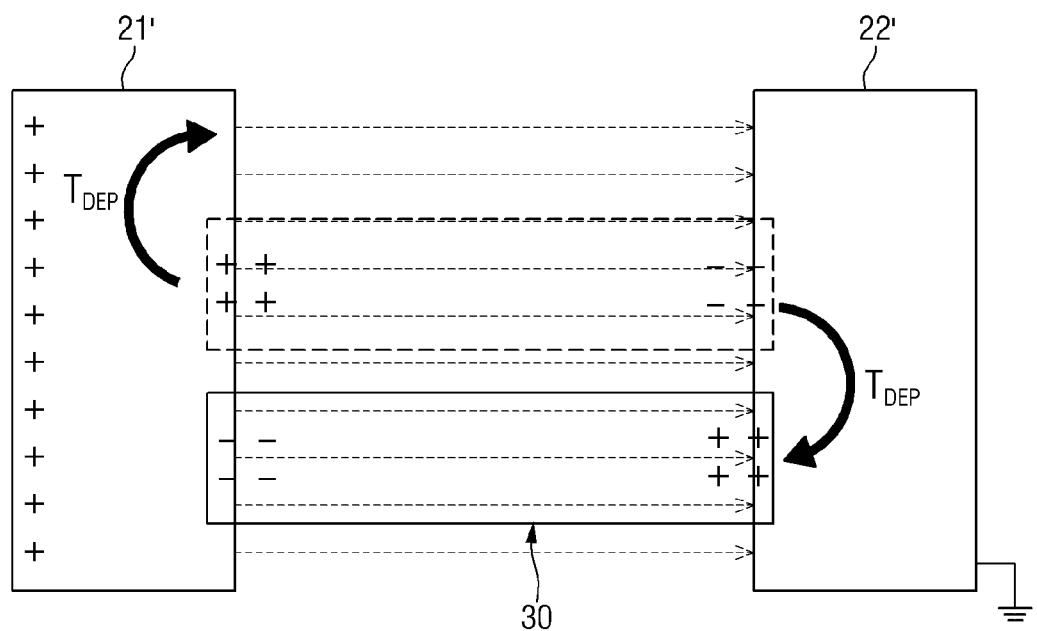
FIG. 18 is a schematic view illustrating how a light-emitting element is arranged during the manufacture of the display device according to an embodiment.

FIG. 13 is a schematic cross-sectional view illustrating the layout of light-emitting elements during the manufacture of the display device according to an embodiment. FIG. 14 is a schematic view illustrating how a light-emitting element is arranged during the manufacture of the display device according to an embodiment. FIG. 15 is a schematic plan view of a subpixel during the manufacture of the display device according to an embodiment. FIG. 16 is a graph showing the effect of a converse electric field-magnetic field of a multiferroic body. FIG. 17 is a schematic cross-sectional view illustrating the layout of light-emitting elements during the manufacture of the display device according to an embodiment. FIG. 18 is a schematic view illustrating how a light-emitting element is arranged during the manufacture of the display device according to an embodiment.

Thereafter, referring to FIG. 13, light-emitting elements 30 are disposed between the first banks BNL1. The light-emitting elements 30 may be disposed on the first insulating material layer PAS1' such that both end portions of each of the light-emitting elements 30 may be placed on the first and second electrode layers 21' and 22'. The light-emitting elements 30 may be sprayed onto the target substrate SUB in a state of being dispersed in the ink IN. In one embodiment, the light-emitting elements 30 may be prepared in a state of being dispersed in the ink IN, which may include a solvent, and may be sprayed onto the target substrate SUB by a printing process using an inkjet printing device. The ink sprayed by the inkjet printing device may be seated in each region surrounded by the second bank BNL2. The second bank BNL2 may prevent the ink IN from spilling over between neighboring subpixels PXn.

As illustrated in FIGS. 13 and 14, once the ink IN including the light-emitting elements 30 is sprayed, the light-emitting elements 30 are arranged on the first insulating material layer PAS1' by applying electrical signals to the electrode layers (21' and 22').

By way of example, as electrical signals, for example, currents, are applied to the electrode layers (21' and 22'), a first electric field "E-Field" may be generated on the electrode layers (21' and 22'). The light-emitting elements 30 dispersed in the ink IN may generate dipole moments in response to an alternating signal being applied to one of the electrode layers (21' and 22'). In response to the first electric field "E-Field" being generated, the rotational torque $T_{DEP}$ is generated in the light-emitting elements 30 where the dipole moments are generated, and as a result, the light-emitting elements ED may be aligned. The light-emitting elements 30 may receive a dielectrophoretic force $F_{DEP}$ due to the first electric field "E-Field" and may thus move toward a stronger electric field, and as a result, both end portions of each of the light-emitting elements 30 may be seated on the electrode layers (21' and 22').

As illustrated in FIG. 15, the light-emitting elements 30 dispersed in the ink may not have a uniform alignment direction, but random directions. Some or a number of the light-emitting elements 30 may be placed in regions other than that between the electrode layers (21' and 22'), for example, between the electrode layers (21' and 22') and the second bank BNL2 or on the electrode layers (21' and 22').

To realign these light-emitting elements 30 on the electrode layers (21' and 22'), a second electric field "E-Field" is generated by applying a magnetic field to one of the electrode layers (21' and 22').

An electric field E, internal magnetic force M, and polarization P of the multiferroic body that forms the electrode layers (21' and 22') are as shown in FIG. 16. The upper part of FIG. 16 shows variations in the electric field over time, and the lower part of FIG. 16 shows variations in the internal magnetic force M and the polarization P over time. Here, line P represents the polarization of the multiferroic body, and line M represents the internal magnetic force of the multiferroic body.

As shown in FIG. 16, in case that a positive (+) electric field E is applied, the polarization P of the multiferroic body that forms the electrode layers (21' and 22') increases, and in case that a negative (−) electric field E is applied, the polarization P of the multiferroic body decreases, but the internal magnetic force M of the multiferroic body increases.

On the contrary, in case that the internal magnetic force M increases, the negative (−) electric field E may be generated, and in case that the internal magnetic force M decreases, the positive (+) electric field E may be generated. The positive (+) or negative (−) electric field E may be generated, and the intensity of the electric field E may be controlled by forming the electrode layers (21' and 22') of the multiferroic body and applying a magnetic field.

As illustrated in FIGS. 17 and 18, a magnetic field with an intensity is applied to one of the electrode layers (21' and 22'). By way of example, a magnetic field may be generated in an external coil by applying a current to the external coil, and the external coil may be applied to the first electrode layer 21'. However, the disclosure is not limited thereto, and any technique may be used as long as it can apply a magnetic field. A magnetic field will hereinafter be described as being applied to, for example, the first electrode layer 21'.

In response to a magnetic field being applied to the first electrode layer 21', the first electrode layer 21', which is formed of the multiferroic body, a second electric field "E-Field" may be generated due to the characteristics of the multiferroic body. The light-emitting elements 30 that are aligned in the ink IN, as illustrated in FIG. 14, may generate dipole moments again due to the second electric field generated in the first electrode layer 21'. The light-emitting elements 30 that are previously aligned by the rotational torque $T_{DEP}$, generated by the previously-generated dipole moments, may be rotated again and realigned. Also, in response to a magnetic field being applied to the first electrode layer 21', the first electrode layer 21', which is formed of the multiferroic body, may generate an electric field with an intensity. As the magnetic field can generate a magnetic force, the magnetic force can be added to the rotational torque for rotating the light-emitting elements 30.

As a rotational torque is generated for all the light-emitting elements 30 that are aligned as illustrated in FIG. 15, most of the light-emitting elements 30 can be rotated and realigned. Accordingly, the light-emitting elements 30 can be realigned by selectively applying a magnetic field to the first electrode layer 21' in each particular area where the degree of alignment of the light-emitting elements 30 is low.

Figure 19:
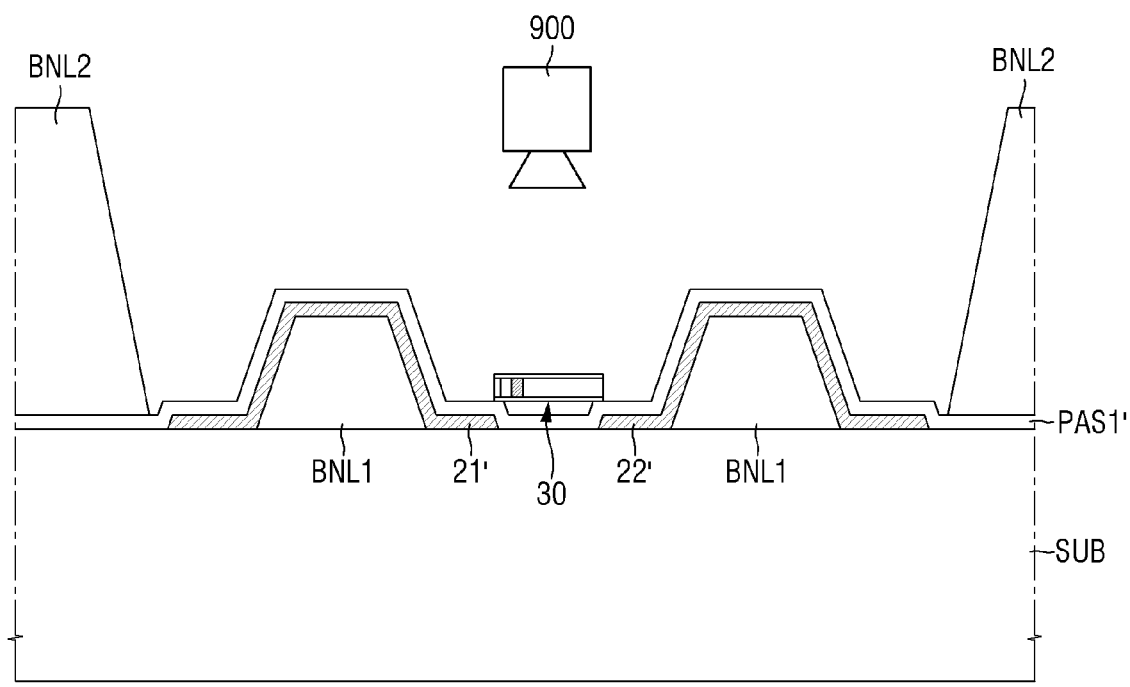
FIG. 19 is a schematic cross-sectional view illustrating how to inspect light-emitting elements aligned on a target substrate, according to an embodiment.

FIG. 19 is a schematic cross-sectional view illustrating how to inspect light-emitting elements aligned on a target substrate, according to an embodiment.

Referring to FIG. 19, the method of manufacturing the display device according to an embodiment may further include measuring the number of light-emitting elements 30 disposed on the target substrate SUB and the locations of the light-emitting elements 30 by using an inspection device 900. The inspection device 900 may acquire an image of an area on the target substrate SUB via a camera and may thus count the number of light-emitting elements 30 disposed in the particular area or measure the orientation directions of light-emitting elements 30 disposed on the electrode layers (21' and 22').

The inspection device 900 may measure the degree of alignment of the light-emitting elements 30 by measuring the locations and the orientation directions of the light-emitting elements 30 disposed on the electrode layers (21' and 22'). For example, if the electrode layers (21' and 22'), which are disposed on the target substrate SUB, extend in one direction or a direction and the light-emitting elements 30 are disposed between the electrode layers (21' and 22'), the inspection device 900 may measure the degree of alignment of the light-emitting elements 30 by measuring the angle between the light-emitting elements 30 and the electrode layers (21' and 22') and the locations of both end portions of each of the light-emitting elements 30 to determine whether both end portions of each of the light-emitting elements 30 are properly placed on the electrode layers (21' and 22').

The method of manufacturing the display device 10 may measure the layout and the degree of alignment of the light-emitting elements 30 in the particular area on the target substrate SUB by using the inspection device 900. Accordingly, the degree of alignment of the light-emitting elements 30 can be improved by selectively applying a magnetic field to the first electrode layer 21' in each particular area where the degree of alignment of the light-emitting elements 30 is low, and thereby realigning the light-emitting elements 30.

As already described above, dipole moments can be generated in the light-emitting elements 30 by applying a magnetic field to the first electrode layer 21', which is formed of the multiferroic body, to generate a new second electric field, and as a result, the light-emitting elements 30 can be rotated again and realigned. Accordingly, as illustrated in FIG. 15, as light-emitting elements 30 that are dispersed in ink, by way of example, those with non-uniform orientation directions, are rotated again and realigned, the locations and orientation directions of the light-emitting elements 30 are changed such that one end portion or an end portion of each of the light-emitting elements 30 may be placed on the first electrode layer 21' and the other end portion of each of the light-emitting elements 30 may be placed on the second electrode layer 22'. As the solvent is removed from the ink IN sprayed on the target substrate SUB, the locations of the light-emitting elements 30 may be fixed.

Figure 20:
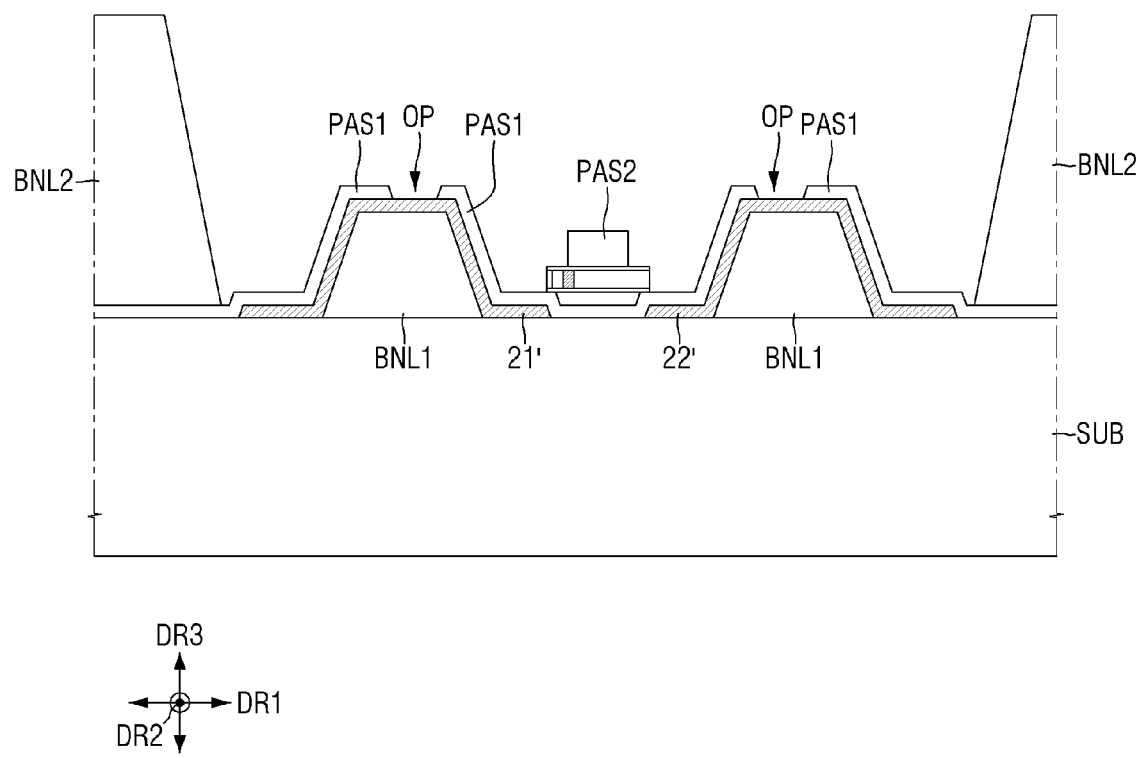
FIG. 20 is a schematic cross-sectional view illustrating processes of the manufacture of the display device according to an embodiment.
Figure 21:
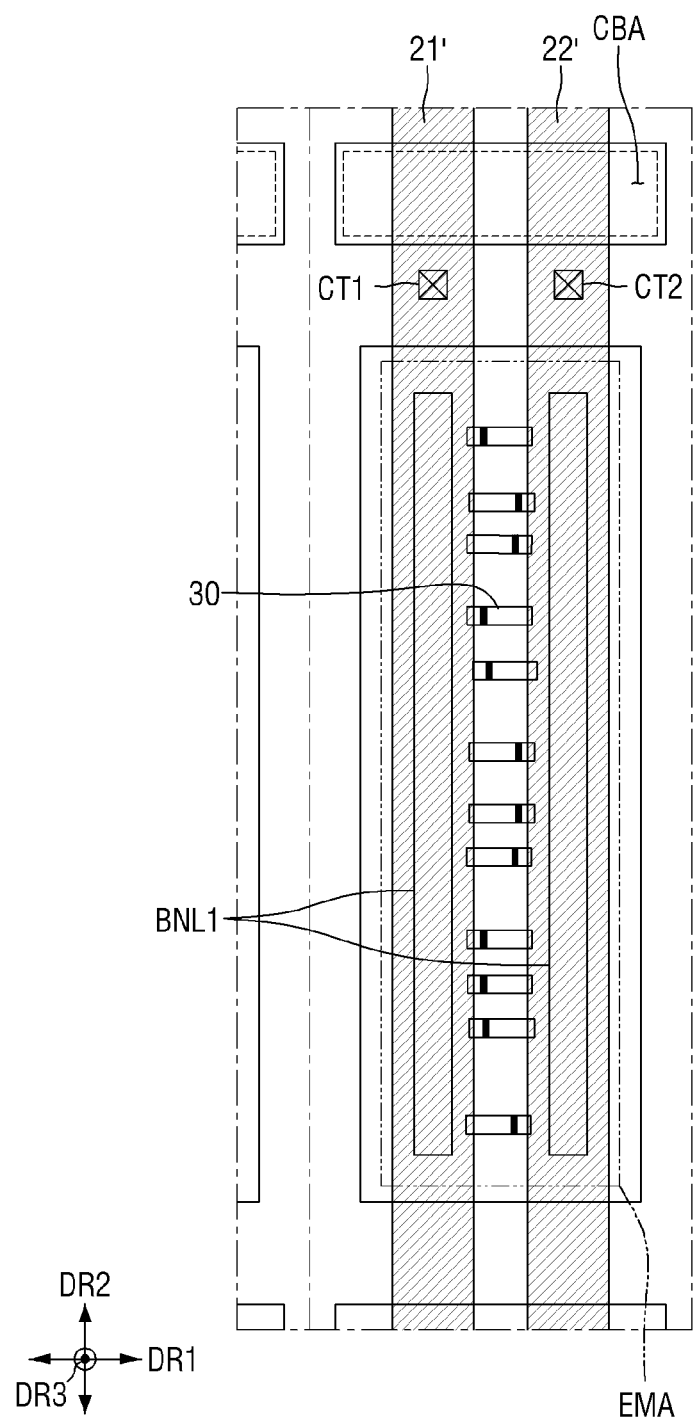
FIG. 21 is a schematic plan view of a subpixel during the manufacture of the display device a display device according to an embodiment.

FIG. 20 is a schematic cross-sectional view illustrating processes of the manufacture of the display device according to an embodiment. FIG. 21 is a schematic plan view of a subpixel during the manufacture of the display device a display device according to an embodiment.

Thereafter, referring to FIG. 20, a first insulating layer PAS1 is formed by removing parts of the first insulating material layer PAS1' to expose the top surfaces of the electrode layers (21' and 22'). The first insulating layer PAS1 may include openings OP, which expose parts of the electrode layers (21' and 22'). Parts of the top surfaces of the electrode layers (21' and 22'), exposed by the openings OP, may be in contact with contact electrodes (26 and 27) that will be described later.

Thereafter, referring to FIG. 21, first and second electrodes 21 and 22 are formed by cutting parts of the first and second electrode layers 21' and 22' in a cut area CBA. As already mentioned above, the first and second electrode layers 21' and 22' may be formed of the multiferroic body. As the multiferroic body is an oxide, the first and second electrode layers 21' and 22' can be prevented from being degraded by being oxidized upon exposure to oxygen during etching.

Thereafter, although not specifically illustrated, the display device 10 may be obtained by forming contact electrodes (CNE1 and CNE2), a third insulating layer PAS3, and a fourth insulating layer PAS4 on the target substrate SUB.

Figure 22:
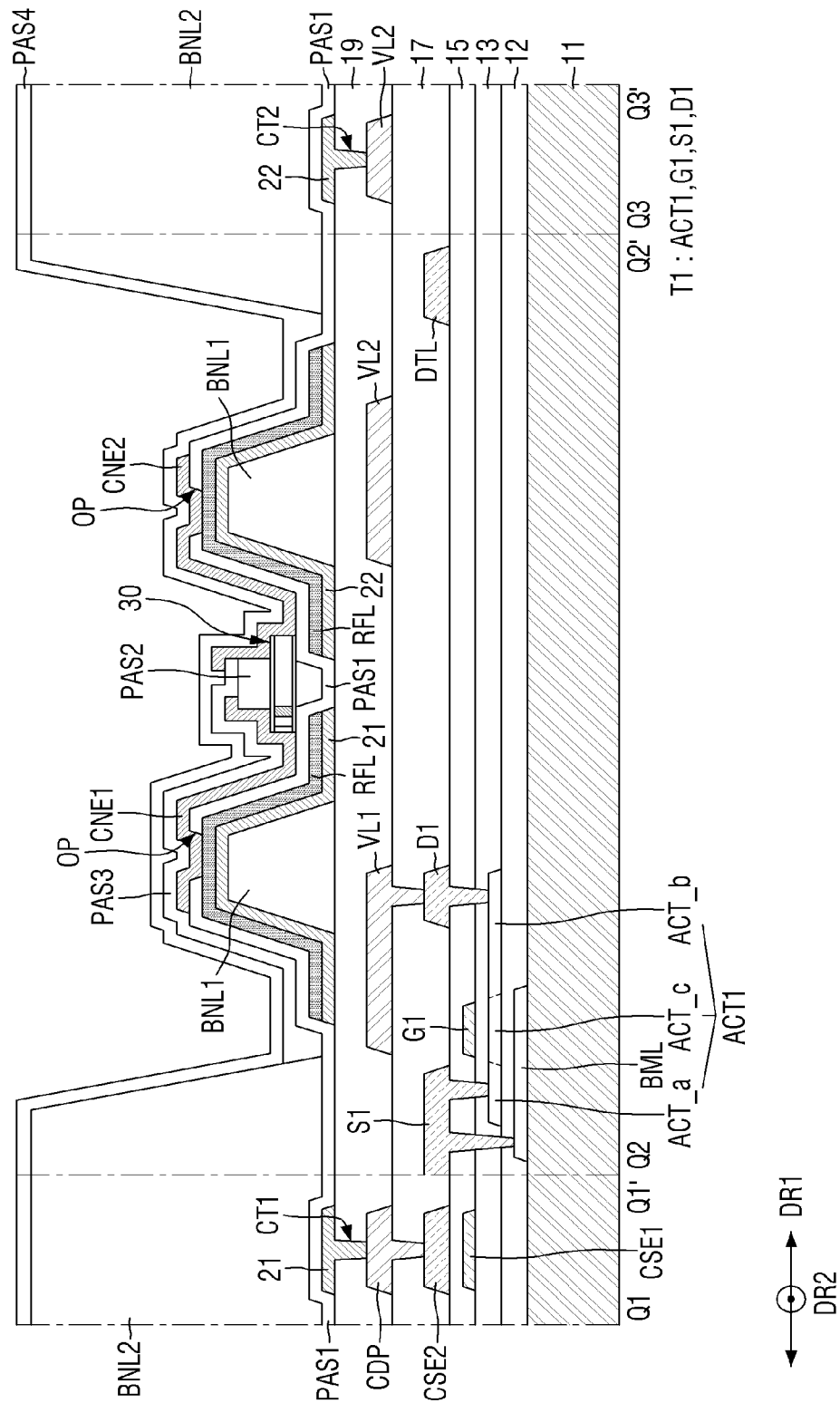
FIG. 22 is a schematic cross-sectional view of a display device according to an embodiment.

FIG. 22 is a schematic cross-sectional view of a display device according to an embodiment.

Referring to FIG. 22, a display device 10 is substantially the same as, or similar to its counterpart of FIG. 3, except that reflective layers RFL are further disposed on first and second electrodes 21 and 22, and will hereinafter be described, focusing on the differences with the display device 10 of FIG. 3.

The reflective layers RFL may be disposed on the first and second electrodes 21 and 22. The reflective layers RFL emit light emitted from light-emitting elements 30, in an upward direction. The reflective layers RFL, which are for compensating for the reflective properties of the first and second electrodes 21 and 22, may be formed of a material having a higher reflectance than the first or second electrode 21 or 22. The reflective layers RFL may include, for example, Co, Cr, Fe, Mn, Zn, Ti, or Cu.

In case that light emitted by the light-emitting elements 30 has a wavelength in a range of about 400 to about 700 nm, $BiFeO_3$, which is one of the multiferroic bodies that may be used in the first and second electrodes 21 and 22, exhibits a reflectance in a range of about 23.7% to about 33.5% for a wavelength band in a range of about 400 nm to about 700 nm. As the above-mentioned metals exhibit a higher reflectance than $BiFeO_3$ for a wavelength band in a range of about 400 nm to about 700 nm, the aforementioned materials of the reflective layers RFL may have higher reflectance than the first or second electrode 21 or 22. Thus, luminance can be improved by enhancing the reflection of light emitted from the light-emitting elements 30.

The display device 10 of FIG. 22 may be obtained by stacking a multiferroic material layer for forming first and second electrode layers 21' and 22', stacking a reflective material layer on the multiferroic material layer, and patterning both the multiferroic material layer and the reflective material layer at a same time during the manufacturing process illustrated in FIG. 8. Subsequent manufacturing processes are the same as illustrated in FIGS. 9 through 18, and thus, detailed descriptions thereof will be omitted.

Figure 23:
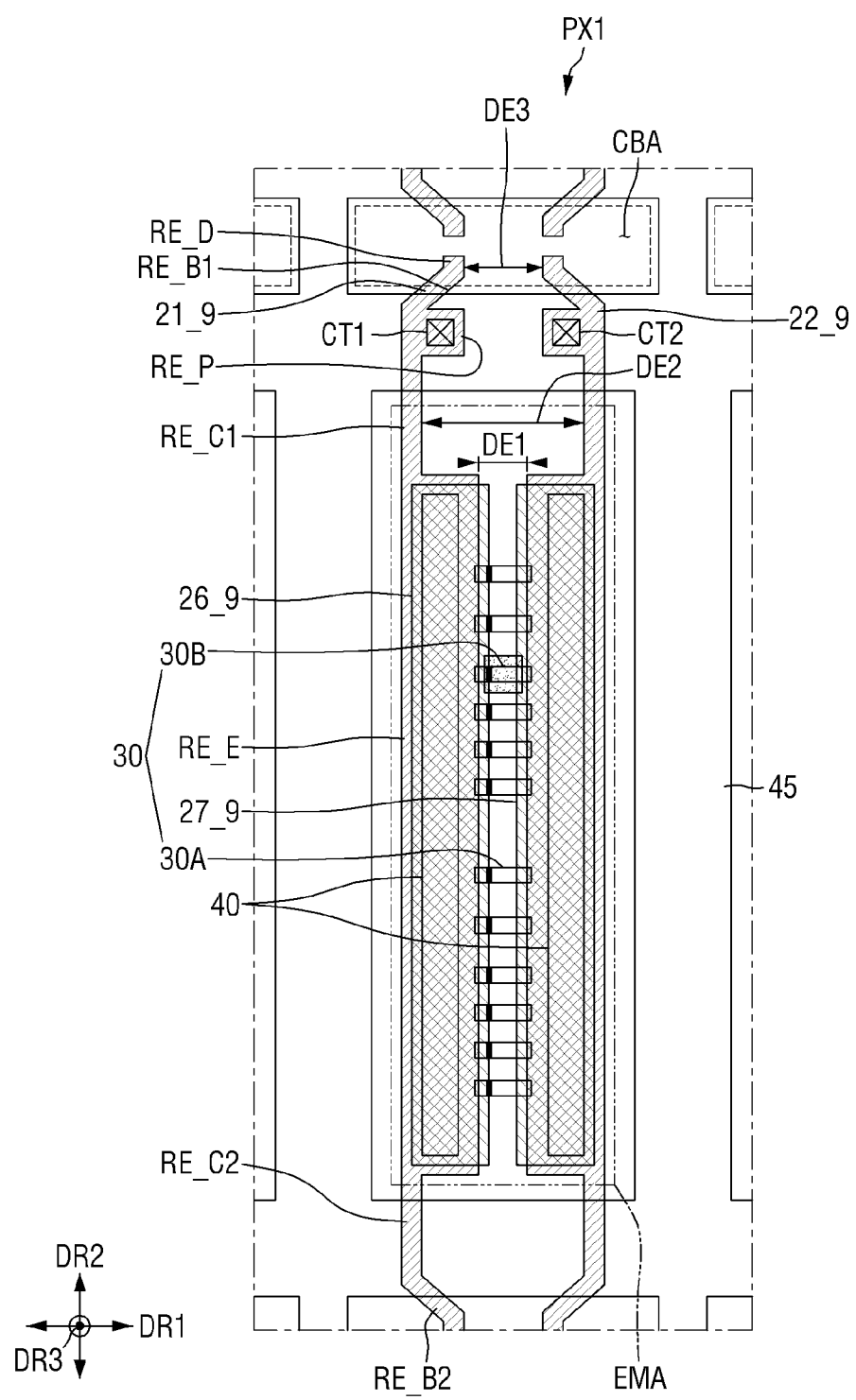
FIG. 23 is a schematic plan view of a subpixel of a display device according to an embodiment.

FIG. 23 is a schematic plan view of a subpixel of a display device according to an embodiment.

Referring to FIG. 23, a display device 10 is substantially the same as, or similar to its counterpart of FIG. 3, except for the shape of first and second electrodes 21 and 22, and will hereinafter be described, focusing on the differences with the display device 10 of FIG. 3.

Referring to FIG. 23, electrodes (21_9 and 22_9) of the display device 10 may extend in a second direction DR2 and may include extended portions RE_E, which have a relatively large width, bent portions (RE_B1 and RE_B2), which extend diagonally with respect to a first direction DR1 or the second direction DR2, and connecting portions (RE_C1 and RE_C2), which connect the bent portions (RE_B1 and RE_B2) and the extended portions (RE_E. The electrodes (21_9 and 22_9) may generally extend in a second direction DR2 and may have a relatively large width in part or be bent in a diagonal direction from the second direction DR2. First and second electrodes 21_9 and 22_9 may be arranged symmetrically with each other. The shape of the first electrode 21_9 will hereinafter be described.

The first electrode 21_9 may include an extended portion RE_E, which has a larger width than the rest of the first electrode 21_9. The extended portion RE_E may be disposed on a first bank 40, in an emission area EMA, and may extend in the second direction DR2. Light-emitting elements 30 may be disposed between and on the first and second electrodes 21_9 and 22_9. First and second contact electrodes 26_9 and 27_9 may be disposed on the extended portions RE_E of the electrodes (21_9 and 22_9) and may be narrower than the extended portions RE_E.

Connecting portions (RE_C1 and RE_C2) may be connected to both sides, in the second direction DR2, of each of the extended portions RE_E. A first connecting portion RE_C1 may be disposed on one side or a side, in the second direction DR2, of each of the extended portions RE_E, and a second connecting portion RE_C2 may be disposed on the other side, in the second direction DR2, of each of the extended portions RE_E. The connecting portions (RE_C1 and RE_C2) may be connected to the extended portions RE_E and may be arranged on and across the emission area EMA of a subpixel PXn and a second bank 45.

First connecting portions RE_C1 and second connecting portions RE_C2 may be narrower than the extended portions RE_E. Sides of each of the connecting portions (RE_C1 and RE_C2) that extend in the second direction DR2 may be connected to sides of each of the extended portions RE_E that extend in the second direction DR2, on the same lines. For example, outer sides of the extended portions RE_E and outer sides the connecting portions (RE_C1 and RE_C2), from the center of the emission area EMA, may extend to be connected to one another. Accordingly, a distance DE1 between the extended portions RE_E of the first and second electrodes 21_9 and 22_9 may be less than a distance DE2 between the connecting portions (RE_C1 and RE_C2).

The bent portions (RE_B1 and RE_B2) are connected to the connecting portions (RE_C1 and RE_C2). The bent portions (RE_B1 and RE_B2) may include first bent portions RE_B1, which are connected to the first connecting portions RE_C1 and are disposed on and across the second bank 45 and a cut area CBA, and second bent portions RE_B2, which are connected to the second connecting portions RE_C2 and are disposed on and across the second bank BNL2 and a cut area CBA of another subpixel PXn. The bent portions (RE_B1 and RE_B2) may be connected to the connecting portions (RE_C1 and RE_C2) and may be bent in a diagonal direction from the second direction DR2, for example, in a direction toward the center of the subpixel PXn. A minimum distance DE3 between the bent portions (RE_B1 and RE_B2) of the first and second electrodes 21_9 and 22_9 may be less than the distance DE2 between the connecting portions (RE_C1 and RE_C2). However, the minimum distance DE3 between the bent portions (RE_B1 and RE_B2) of the first and second electrodes 21_9 and 22_9 may be greater than the distance DE1 between the extended portions RE_E.

Contact portions RE_P, which have a relatively large width, may be formed in areas where the first connecting portions RE_C1 and the first bent portions RE_B1 are connected. The contact portions RE_P may overlap the second bank BNL2, and first and second contact holes CT1 and CT2 of the first and second electrodes 21_9 and 22_9 may be formed.

Fragments RE_D, which are separated from the first and second electrodes 21_9 and 22_9 in the cut area CBA, may be formed at ends of the first bent portions RE_B1. The fragments RE_D may be parts that remain unremoved after the separation of the electrodes (21_9 and 22_9) from electrodes (21_9 and 22_9) of a neighboring subpixel PXn in the second direction DR2, in the cut area CBA.

The embodiment of FIG. 23 differs from the embodiment of FIG. 2 in that the first and second electrodes 21_9 and 22_9 include the extended portions RE_E, the connecting portions (RE_C1 and RE_C2), and the bent portions (RE_B1 and RE_B2) and are arranged symmetrically with respect to the center of the subpixel PXn. However, the disclosure is not limited to the embodiment of FIG. 23, and in an embodiment, the first and second electrodes 21_9 and 22_9 may have different shapes.

Figure 24:
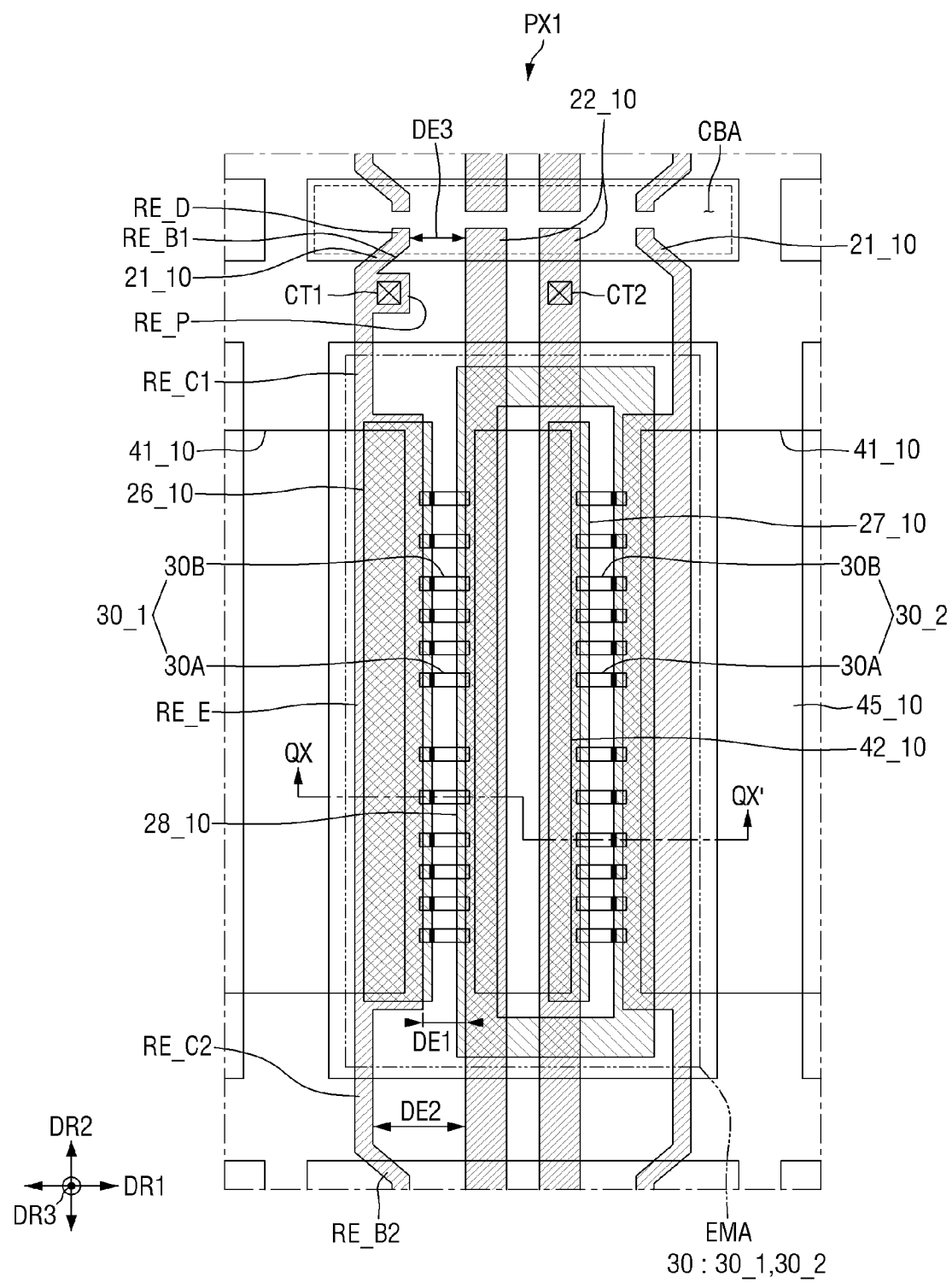
FIG. 24 is a schematic plan view of a subpixel of a display device according to an embodiment.
Figure 25:
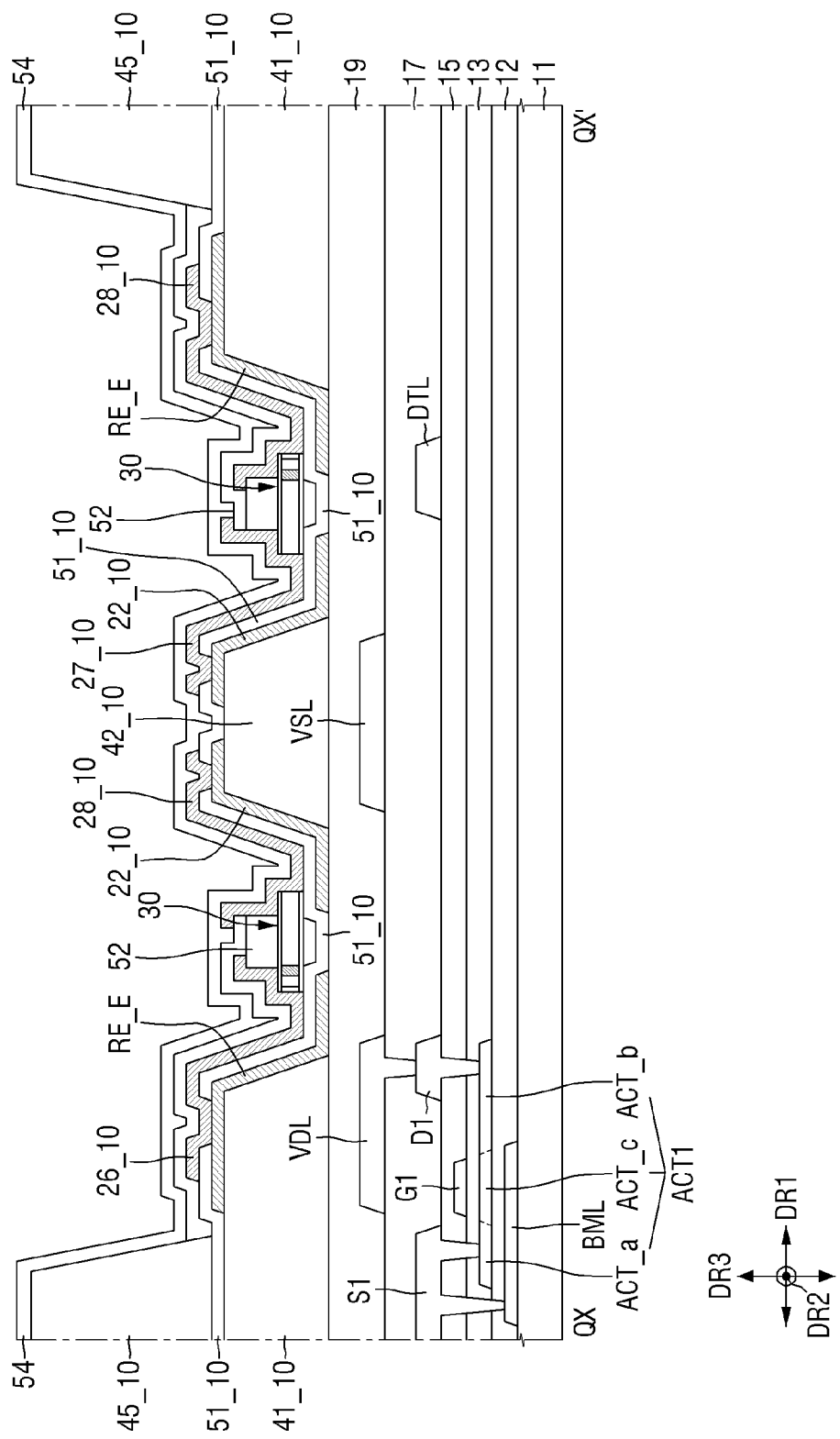
FIG. 25 is a schematic cross-sectional view taken along line QX-QX' of FIG. 24.

FIG. 24 is a schematic plan view of a subpixel of a display device according to an embodiment. FIG. 25 is a schematic cross-sectional view taken along line QX-QX' of FIG. 24.

Referring to FIGS. 24 and 25, a display device 10 may include, in each subpixel PXn, first electrodes 21_10 and second electrodes 22_10. The first electrodes 21_10 may have a same shape as their counterpart of FIG. 2, and multiple first electrodes 21_10, for example, two first electrodes 21_10, may be symmetrically arranged with respect to the center of a subpixel PXn. Multiple second electrodes having a same shape as their counterpart of FIG. 2, for example, two second electrodes 22_10, may be arranged between the first electrodes 21_10. The distance between the first electrodes 21_10 and the second electrodes 22_10 may vary from one location to another location on each of the first electrodes 21_10. For example, a distance DE1 and extended portions RE_E and the second electrodes 22_10 may be less than a distance DE2 between connecting portions (RE_C1 and RE_C2) and the second electrodes 22_10 and a distance DE3 between bent portions (RE_B1 and RE_B2) and the second electrodes 22_10. The distance DE2 between the connecting portions (RE_C1 and RE_C2) and the second electrodes 22_10 may be greater than the distance DE3 between the bent portions (RE_B1 and RE_B2) and the second electrodes 22_10, but the disclosure is not limited thereto. The shape of electrodes (21_10 and 22_10) may be the same as the shape of their respective counterparts of FIG. 2 or 23, and thus, a detailed description thereof will be omitted.

The layout and the shape of first banks 40, a first insulating layer 51_10, and contact electrodes (26_10, 27_10, and 28_10) in each subpixel PXn may vary depending on the layout of the first electrodes 21_10 and the second electrodes 22_10.

The first insulating layer 51_10 may be disposed between the extended portions RE_E of the first electrodes 21_10 and the second electrodes 22_10, and sides of the first insulating layer 51_10 may overlap the extended portions RE_E of the first electrodes 21_10 and the second electrodes 22_10. First end portions of light-emitting elements 30 may be disposed on the extended portions RE_E of the first electrodes 21_10, and second end portions of the light-emitting elements 30 may be disposed on the second electrode 22_10.

The first bank 40 may include first sub-banks 41_10 and a second sub-bank 42_10. The first sub-banks 41_10 and the second sub-bank 42_10 may extend in a second direction DR2 and may have different widths in a first direction DR1. As the first sub-banks 41_10 have a larger width than the second sub-bank 42_10, the first sub-banks 41_10 may be disposed over the boundaries with neighboring subpixels PXn in the first direction DR1. For example, the first sub-banks 41_10 may be disposed even over emission areas EMA of the neighboring subpixels PXn and boundaries between the emission areas EMA. As a result, parts of a second bank 45_10 extending in the second direction DR2 may be disposed on the first sub-banks 41_10. Two first sub-banks 41_10 may be disposed in part in one subpixel PXn. One second sub-bank 42_10 may be disposed between the first sub-bank 41_10.

The second sub-bank 42_10 may extend in the second direction DR2, in the middle of an emission area EMA of the subpixel PXN. The second sub-bank 42_10 may have a smaller width than the first sub-banks 41_10 and may be spaced apart from the first sub-banks 41_10, between the first sub-banks 41_10.

The extended portions RE_E of the first electrodes 21_10 and the second bank 45_10 may be disposed on the first sub-banks 41_10. Extended portions RE_E of first electrodes 21_10 of subpixels PXn that are adjacent to each other in the first direction DR1 may be disposed on each of the first sub-banks 41_10. For example, extended portions RE_E of two first electrodes 21_10 may be disposed on one first sub-bank 41_10. Two second electrodes 22_10 may be disposed on the second sub-bank 42_10. The second electrodes 22_10 may be disposed on both sides of the second sub-bank 42_10 that extend in the second direction DR2 and may be spaced apart from each other, on the second sub-bank 42_10.

One of the first electrodes 21_10 may include a contact portion RE_P, in which a first contact hole CT1 is formed, and no contact portion RE_P may be formed in the other first electrode 21_10. Similarly, a contact portion RE_P and a second contact hole CT2 may be formed in one of the second electrodes 22_10, and no contact portion RE_P may be formed in the other second electrode 22_10. Electrodes (21_10 and 22_10) connected to a first transistor T1 or a second voltage line VL2 may receive electrical signals from the first transistor T1 or the second voltage line VL2, and other electrodes (21_10 and 22_10) may receive electrical signals through the contact electrodes (26_10, 27_10, and 28_10).

The light-emitting elements 30 may be disposed on the first insulating layer 51_10 with their both end portions placed on the extended portions RE_E of the first electrodes 21_10 and the second electrodes 22_10. First end portions of the light-emitting elements 30 where second semiconductor layers 32 are disposed may be placed on the first electrodes 21_10. Accordingly, the direction faced by first end portions of first-type light-emitting elements 30_1, which are disposed between electrodes (21_10 and 22_10) on the left side of the center of the subpixel PXn, may be opposite to the direction faced by first end portions of second-type light-emitting elements 30_2, which are disposed between electrodes (21_10 and 22_10) on the right side of the center of the subpixel PXn.

As the display device 10 may include a relatively large number of electrodes (21_10 and 22_10), the display device 10 may include a relatively large number of contact electrodes (26_10, 27_10, and 28_10).

In one embodiment, the contact electrodes (26_10, 27_10, and 28_10) may include a first contact electrode 26_10, which is disposed on one of the first electrodes 21_10, a second contact electrode 27_10, which is disposed on one of the second electrodes 22_10, and a third contact electrode 28_10, which is disposed on the other first electrode 21_10 and the other second electrode 22_10 and surrounds the second contact electrode 27_10.

The first contact electrode 26_10 is disposed on one of the first electrodes 21_10. For example, the first contact electrode 26_10 may be disposed on the extended portion RE_E of the first electrode 21_10 where the first end portions of the first-type light-emitting elements 30_1 are disposed. The first contact electrode 26_10 may be in contact with the extended portion RE_E of one of the first electrode 21_10 and with first end portions of first light-emitting elements 30A. The second contact electrode 27_10 is disposed on one of the second electrodes 22_10. For example, the second contact electrode 27_10 is disposed on the second electrode 22_10 where second end portions of the second-type light-emitting elements 30_2 are disposed. The second contact electrode 27_10 may be in contact with one of the second electrodes 22_10 and with second end portions of second light-emitting elements 30B. The first and second contact electrodes 26_10 and 27_10 may be in contact with electrodes (21_10 and 22_10) where the first and second contact holes CT1 and CT2 are formed. The first contact electrode 26_10 may be in contact with a first electrode 21_10 electrically connected to the first transistor T1, through the first contact hole CT1, and the second contact electrode 27_10 may be in contact with a second electrode 22_10 electrically connected to the second voltage line VL2, through the second contact hole CT2. The first and second contact electrodes 26_10 and 27_10 may transmit electrical signals from the first transistor T1 or the second voltage line VL2 to the light-emitting elements 30. The first and second contact electrodes 26_10 and 27_10 are substantially the same as described above.

Electrodes (21_10 and 22_10) where the first and second contact holes CT1 and CT2 are not formed may be further disposed in the subpixel PXn. The electrodes (21_10 and 22_10) where the first and second contact holes CT1 and CT2 are not formed may be in a state of being floated with substantially no electrical signals being able to be applied thereto from the first transistor TR1 or the second voltage line VL2. The third contact electrode 28_10 may be disposed on the electrodes (21_10 and 22_10) where the first and second contact holes CT1 and CT2 are not formed, and electrical signals transmitted to the light-emitting elements 30 may flow through the third contact electrode 28_10.

The third contact electrode 28_10 may be disposed on the electrodes (21_10 and 22_10) where the first and second contact holes CT1 and CT2 are not formed, to surround the second contact electrode 27_10. The third contact electrode 28_10 may include parts extending in the second direction DR2 and a part extending in the first direction DR1 to connect the parts extending in the second direction DR2 and may thus surround the second contact electrode 27_10. The parts of the third contact electrode 28_10 extending in the second direction DR2 may be disposed on the electrodes (21_10 and 22_10) where the first and second contact holes CT1 and CT2 are not formed, and may be in contact with the light-emitting elements 30. For example, parts of the third contact electrode 28_10 on the second electrodes 22_10 may be in contact with the second end portions of the first light-emitting elements 30A, and parts of the third contact electrode 28_10 on the first electrodes 21_10 may be in contact with first end portions of the second light-emitting elements 30B. The part of the third contact electrode 28_10 extending in the first direction DR1 may overlap, but may not be directly connected to, a second electrode 22_10 where the second contact hole CT2 is formed, because of the presence of another insulating layer (not illustrated).

Electrical signals from the first contact electrode 26_10 to the first end portions of the first-type light-emitting elements 30_1 may be transmitted to the third contact electrode 28_10, which is in contact with second end portions of the first-type light-emitting elements 30_1. The third contact electrode 28_10 may transmit the electrical signals to the first end portions of the second light-emitting elements 30B and may be transmitted to the second electrodes 22_10 through the second contact electrode 27_10. Accordingly, electrical signals for causing the light-emitting elements 30 to emit light may be transmitted only to one first electrode 21_10 and one second electrode 22_10, and the first-type light-emitting elements 30_1 and the second-type light-emitting elements 30_2 may be connected in series through the third contact electrode 28_10.

In the embodiments of FIGS. 23 through 25, as already mentioned above, the first electrode(s) 21_9 or 21_10 and the second electrode(s) 22_9 or 22_10 may include a multiferroic body. As the first electrode(s) 21_9 or 21_10 and the second electrode(s) 22_9 or 22_10 include the multiferroic body, which is an oxide, any degradation in the properties of the first electrode(s) 21_9 or 21_10 and the second electrode (s) 22_9 or 22_10 that may be caused by oxidation can be prevented. In response to an electric field being applied to the first electrode(s) 21_9 or 21_10 and the second electrode (s) 22_9 or 22_10, a magnetic field with an intensity may be induced and generated. The first electrode(s) 21_9 or 21_10 and the second electrode(s) 22_9 or 22_10 may generate a magnetic field with an intensity in a range of about 0.10 to about 3.39 emu/g. The first electrode(s) 21_9 or 21_10 and the second electrode(s) 22_9 or 22_10 may include a material exhibiting multiferroic properties at room temperature, and a Curie temperature Tc at which the first electrode(s) 21_9 or 21_10 and the second electrode(s) 22_9 or 22_10 exhibit multiferroic properties may be about 800° C. or lower. The first electrode(s) 21_9 or 21_10 and the second electrode(s) 22_9 or 22_10 may have a light reflectance in a range of about 20 to about 85% for a wavelength band in a range of about 400 to about 700 nm.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:
   banks extending in a first direction on a substrate, the banks spaced apart from each other;
   first electrodes and second electrodes extending in the first direction, the first electrodes and the second electrodes disposed on different banks and spaced apart from each other;
   an insulating layer disposed on the substrate, the insulating layer partially covering the first electrodes and the second electrodes; and
   light-emitting elements disposed on the insulating layer, end portions of each of the light-emitting elements disposed on the first electrodes and the second electrodes,
   wherein the first electrodes and the second electrodes generate an electric field in response to an applied magnetic field.

2. The display device of claim 1, wherein the first electrodes and the second electrodes have a reflectance in a range of about 20 to about 85% for a wavelength band in a range of about 400 nm to about 700 nm.

3. The display device of claim 1, wherein the first electrodes and the second electrodes have a Curie temperature of about 800° C. or less.

4. The display device of claim 1, wherein the first electrodes and the second electrodes include at least one selected from $BiFeO_3$, hexa-ferrites, $TbMn_2O_5$, and $CoCr_2O_4$.

5. The display device of claim 1, wherein, the first electrodes and the second electrodes generate a magnetic field in response to an applied electric field.

6. The display device of claim 1, further comprising:
   a reflective layer disposed between the first electrodes and the insulating layer and between the second electrodes and the insulating layer.

7. The display device of claim 6, wherein the reflective layer has a higher reflectance than a reflectance of the first electrodes or the second electrodes.

8. The display device of claim 1, further comprising:
   a first contact electrode disposed on the first electrodes electrically contacting first end portions of the light-emitting elements; and a second contact electrode disposed on the second electrodes electrically contacting second end portions of the light-emitting elements.

9. The display device of claim 1, wherein
each of the light-emitting elements includes:
- a first semiconductor layer;
- a second semiconductor layer; and
- at least one light-emitting layer disposed between the first semiconductor layer and the second semiconductor layer, and the first semiconductor layer, the second semiconductor layer, and the at least one light-emitting layer are surrounded by an insulating film.

10. A method of manufacturing a display device, comprising:
- preparing a substrate including first electrode layers and second electrode layers, and spraying ink including a solvent and light-emitting elements dispersed in the solvent onto the substrate;
- generating a first electric field on the substrate and primarily aligning light-emitting elements on the first electric field on the substrate; and
- generating a second electric field by applying a magnetic field to the first electrode layers or the second electrode layers, and secondarily aligning the light-emitting elements on the substrate.

11. The method of claim 10, wherein the first electric field is generated by a current flowing into the first electrode layers or the second electrode layers.

12. The method of claim 10, wherein in the secondarily aligning of the light-emitting elements, the magnetic field is applied to the first electrode layers or the second electrode layers by application of an external coil.

13. The method of claim 12, wherein the first electrode layers or the second electrode layers generate the second electric field in accordance with an intensity of the magnetic field.

14. The method of claim 13, wherein the light-emitting elements are rotated and realigned by inducing dipole moments in the light-emitting elements with the second electric field to apply a rotational torque to the light-emitting elements.

15. The method of claim 14, wherein the rotational torque is applied to the light-emitting elements by a magnetic force of the first electrode layers or the second electrode layers to which the magnetic field is applied.

16. The method of claim 10, wherein after the primarily aligning of the light-emitting elements,
- a degree of alignment of the light-emitting elements is measured from an area to another area of the substrate, and
- the magnetic field is applied to areas where the degree of alignment of the light-emitting elements is low.

17. The method of claim 16, wherein the degree of alignment of the light-emitting elements is measured by acquiring an image of each area of the substrate by an inspection device including a camera, and measuring an orientation direction of the light-emitting elements.

18. The method of claim 17, wherein the orientation direction of the light-emitting elements is measured by measuring locations of end portions of each of light-emitting elements disposed between the first electrode layers and the second electrode layers.

19. The method of claim 10, further comprising:
- after the secondarily aligning of the light-emitting elements, removing the solvent and fixing the light-emitting elements such that first end portions of the light-emitting elements are disposed on the first electrode layers and second end portions of the light-emitting elements are disposed on the second electrode layers.

20. The method of claim 19, further comprising:
- forming an insulating layer on the substrate with the solvent removed and disconnecting parts of the first electrode layers and the second electrode layers.

* * * * *